United States Patent
Ban et al.

(10) Patent No.: US 9,354,519 B2
(45) Date of Patent: May 31, 2016

(54) METHODS OF FORMING PATTERNS

(71) Applicant: SK hynix Inc., Gyeonggi-do (KR)

(72) Inventors: Keun Do Ban, Gyeonggi-do (KR); Cheol Kyu Bok, Gyeongsangbuk-do (KR); Jung Gun Heo, Daejeon (KR); Hong Ik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/621,049

(22) Filed: Feb. 12, 2015

(65) Prior Publication Data

US 2016/0077435 A1 Mar. 17, 2016

(30) Foreign Application Priority Data

Sep. 16, 2014 (KR) ........................ 10-2014-0123032

(51) Int. Cl.
  *G03F 7/00* (2006.01)
  *G03F 7/16* (2006.01)
  *G03F 7/30* (2006.01)
  *G03F 7/11* (2006.01)
  (Continued)

(52) U.S. Cl.
  CPC .............. *G03F 7/168* (2013.01); *C09D 153/00* (2013.01); *G03F 7/002* (2013.01); *G03F 7/11* (2013.01); *G03F 7/165* (2013.01); *G03F 7/30* (2013.01); *G03F 7/40* (2013.01); *H01L 21/0276* (2013.01); *H01L 21/0337* (2013.01); *C08F 293/00* (2013.01); *C08L 53/005* (2013.01); *H01L 21/31058* (2013.01)

(58) Field of Classification Search
  CPC .............. G03F 7/004; G03F 7/11; G03F 7/30; G03F 7/40; G03F 7/002; G03F 7/165; H01L 21/0273; H01L 21/0276; H01L 21/0337; H01L 21/31058; C08F 293/00; C08L 53/005; C09D 153/00

USPC .............. 430/270.1, 269, 322, 325, 329, 330, 430/331; 427/256; 438/703, 761; 525/88
See application file for complete search history.

(56) References Cited

U.S. PATENT DOCUMENTS

| | | | |
|---|---|---|---|
| 7,563,563 B2 | 7/2009 | Chen et al. | |
| 8,623,458 B2 * | 1/2014 | Cheng | B82Y 10/00 427/256 |
| 8,900,468 B2 * | 12/2014 | Kim | G03F 7/0035 216/46 |
| 9,159,558 B2 * | 10/2015 | Cheng | B81C 1/00031 |
| 2011/0147984 A1 | 6/2011 | Cheng et al. | |

(Continued)

FOREIGN PATENT DOCUMENTS

KR 1020100079948 7/2010

OTHER PUBLICATIONS

Cameron, J., et al., Design and Development of Developable BARCs (DBARCs) for Advanced Lithographic Applications, Journal of Photopolymer Science and Technology, 2010, pp. 721-729. vol. 23, No. 5.

*Primary Examiner* — Amanda C Walke

(74) *Attorney, Agent, or Firm* — IP & T Group LLP

(57) ABSTRACT

A method of forming patterns includes: forming guide patterns on an underlying layer, forming a self-assembling block copolymer (BCP) layer on the guide patterns and the underlying layer, annealing the self-assembling BCP layer to form first polymer block domains and second polymer block domains which are alternately and repeatedly arrayed, and selectively removing the first polymer block domains. The guide patterns are formed of a developable antireflective material. In addition, the guide patterns are spaced apart from each other such that a width of each of the guide patterns is less than a distance between the guide patterns.

20 Claims, 27 Drawing Sheets

(51) Int. Cl.
*G03F 7/40* (2006.01)
*H01L 21/027* (2006.01)
*H01L 21/033* (2006.01)
*C09D 153/00* (2006.01)
*H01L 21/3105* (2006.01)
*C08F 293/00* (2006.01)
*C08L 53/00* (2006.01)

(56) References Cited

U.S. PATENT DOCUMENTS

2014/0335324 A1 11/2014 Kim et al.
2015/0329664 A1* 11/2015 Cheng .................. C09D 169/00
427/256

* cited by examiner

DOMAIN 'A'   DOMAIN 'B'

METHODS OF FORMING PATTERNS

CROSS-REFERENCE TO RELATED APPLICATION

The present application claims priority under 35 U.S.C 119(a) to Korean Application No. 10-2014-0123032, filed on Sep. 16, 2014, which is incorporated herein by reference in its entirety as set forth in full.

BACKGROUND

1. Technical Field

Various embodiments of the present disclosure relate to methods of fabricating semiconductor devices and, more particularly, to methods of forming fine patterns.

2. Related Art

In the fabrication of semiconductor devices much effort has been focused on integrating more patterns within a limited area. That is, attempts to increase the integration density of semiconductor devices have typically resulted in the formation of finer and finer patterns. Various techniques have been proposed to form finer patterns, such as forming small contact holes with nano-scale critical dimensions (CD), in the range of a few nanometers to tens of nanometers.

When forming fine patterns using only photolithography, there are limitations due to the image resolution limits of the equipment used in the photolithography process. Forming fine patterns using self-assembly of polymer molecules may be a candidate for overcoming the image resolution limits, which are due to the nature of the optical systems used in the photolithography process, such as the wavelength of light generated from the light sources of optical systems used in the photolithography process.

SUMMARY

Various embodiments are directed to methods of forming patterns using self assembling polymer molecules.

According to an embodiment, a method of forming patterns includes forming a developable antireflective layer on an underlying layer disposed on a semiconductor substrate, forming a photoresist layer on the developable antireflective layer, selectively exposing portions of the photoresist layer and portions of the developable antireflective layer to light, selectively removing non-exposed regions of the photoresist layer to form a photoresist pattern exposing non-exposed regions of the developable antireflective layer, selectively removing the exposed regions of the developable antireflective layer to form guide patterns, forming a neutral layer that fills a space between the guide patterns, forming a self-assembling block copolymer (BCP) layer on the guide patterns and the neutral layer, annealing the self-assembling BCP layer to form first polymer block domains and second polymer block domains which are alternately and repeatedly arrayed, and selectively removing the first polymer block domains.

According to another embodiment, a method of forming patterns includes forming a developable antireflective layer on an underlying layer disposed on a semiconductor substrate, forming a photoresist layer on the developable antireflective layer, selectively exposing portions of the photoresist layer and portions of the developable antireflective layer to light to define line-shaped non-exposed regions of the photoresist layer and the developable antireflective layer, selectively removing the non-exposed regions of the photoresist layer to form a photoresist pattern that provides trenches exposing the non-exposed regions of the developable antireflective layer, selectively removing the exposed regions of the developable antireflective layer to form line-shaped guide patterns having a width which is less than a distance between the line-shaped guide patterns, forming a neutral layer that fills a space between the guide patterns, forming a self-assembling block copolymer (BCP) layer on the guide patterns and the neutral layer, annealing the self-assembling BCP layer to form line-shaped first polymer block domains and line-shaped second polymer block domains which are alternately and repeatedly arrayed, and selectively removing the first polymer block domains.

According to another embodiment, a method of forming patterns includes forming a developable antireflective layer on an underlying layer disposed on a semiconductor substrate, forming a photoresist layer on the developable antireflective layer, selectively exposing portions of the photoresist layer and portions of the developable antireflective layer to light to define island-shaped non-exposed regions of the photoresist layer and the developable antireflective layer, selectively removing the non-exposed regions of the photoresist layer to form a photoresist pattern exposing the non-exposed regions of the developable antireflective layer, selectively removing the exposed regions of the developable antireflective layer to form island-shaped guide patterns having a width which is less than a distance bet the line-shaped guide patterns, forming a neutral layer that fills a space between the guide patterns, forming a self-assembling block copolymer (BCP) layer on the guide patterns and the neutral layer, annealing the self-assembling BCP layer to form first polymer block domains and a second polymer block domain surrounding sidewalls of the first polymer block domains, and selectively removing the first polymer block domains to form holes.

According to another embodiment, a method of forming patterns includes forming a neutral layer on an underlying layer disposed on a semiconductor substrate, forming a developable antireflective layer on the neutral layer, forming a photoresist layer on the developable antireflective layer, selectively exposing portions of the photoresist layer and portions of the developable antireflective layer to light, selectively removing non-exposed regions of the photoresist layer to form a photoresist pattern exposing non-exposed regions of the developable antireflective layer, selectively removving the exposed regions of the developable antireflective layer to form guide patterns exposing portions of the neutral layer, forming a self-assembling block copolymer (BCP) layer on the guide patterns and the exposed neutral layer, annealing the self-assembling BCP layer to form first polymer block domains and second polymer block domains which are alternately and repeatedly arrayed, and selectively removing the first polymer block domains.

According to another embodiment, a method of forming patterns includes forming guide patterns on an underlying layer disposed on a semiconductor substrate. The guide patterns are formed of a developable antireflective material. The guide patterns are spaced apart from each other such that a width of each of the guide patterns is less than a distance between the guide patterns. A self-assembling block copolymer (BCP) layer is formed on the guide patterns and the underlying layer. The self-assembling BCP layer includes a first polymer block component and a second polymer block component The self-assembling BCP layer is annealed to form first polymer block domains and second polymer block domains which are alternately and repeatedly arrayed. The first polymer block domains are selectively removed. The first polymer block domains are formed of the first polymer block component and the second polymer block domains are formed of the second polymer block component. First domains of the first polymer block domains are formed on the guide patterns. The second polymer block domains and second domains of the first polymer block domains are alternately and repeatedly arrayed between the guide patterns.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
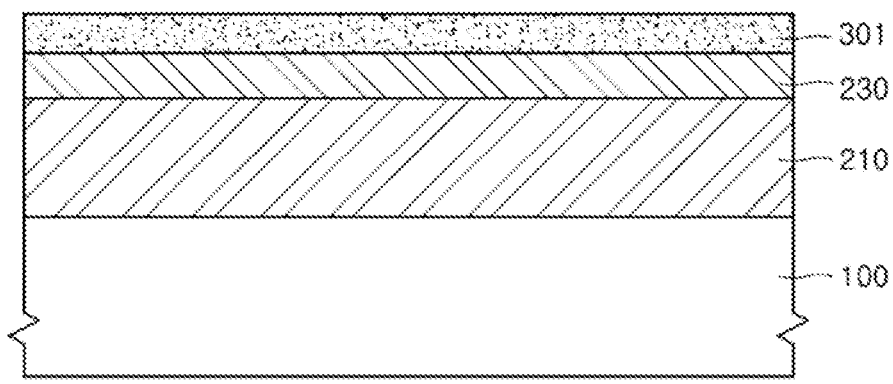
FIGS. 1 to 13 are cross-sectional views illustrating a method of forming fine patterns according to an embodiment of the present disclosure.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under", "beneath," "below", "lower," "on", "over", "above," "upper", "side" or "aside" another element, it can directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the scope of the present disclosure. Other words used to describe the relationship between elements or layers should be interpreted in a like fashion, for example, "between" versus "directly between" or "adjacent" versus "directly adjacent".

Some embodiments of the present disclosure may provide methods of forming line and space patterns using phase separation of a block copolymer (BCP) layer. In addition, some embodiments of the present disclosure may provide methods of forming a hole array pattern using phase separation of the BCP layer. The following embodiments may utilize a direct self-assembly (DSA) process that uses phase separation of a BCP layer. Thus, according to the embodiments, fine patterns or fine spaces may be formed with dimensions that are less than the resolution limits of typical photolithography processes. For example, specific polymer blocks in the BCP layer may be ordered and phase-separated to form domain portions under controlled conditions, and the phase-separated domain portions may be selectively removed to form spaces or patterns having nano-scale feature size. Here, nano-scale feature size is intended to mean from few nanometers to tens of nanometers.

A self-assembled structure of the BCP layer may be formed to have a cylindrical shape or a lamellar shape depending on the volume ratio of two or more distinct polymer blocks constituting the BCP layer, the annealing temperature for the phase separation of the BCP layer, the molecule size of the polymer blocks constituting the BCP layer, and the molecular weight of the polymer blocks constituting the BCP layer. That is, the domain portions of the polymer blocks, which are phase-separated, may be formed to have a cylindrical shape or a lamellar shape. If the self-assembled structure of the BCP layer has a cylindrical shape, the BCP layer may be used to form a hole array pattern. If the self-assembled structure of the BCP layer has a lamellar shape, the BCP layer may be used to form a line and space pattern.

Various embodiments of the present disclosure may be applied to fabrication of highly integrated semiconductor devices, for example, phase changeable random access memory (PcRAM) devices or resistive random access memory (ReRAM) devices including an array of storage nodes having a fine feature size in a cell region and an array of interconnection lines connected to the storage nodes. Moreover, the following embodiments may be applied to the formation of conductive vias and conductive lines which are regularly or irregularly arrayed. In addition, the following embodiments may be applied to the fabrication of memory devices such as static random access memory (SRAM) devices, flash memory devices, magnetic random access memory (MRAM) devices and ferroelectric random access memory (FeRAM) devices or to the fabrication of logic devices such as control devices, central processing units (CPU) and arithmetic logic units (ALU).

FIGS. 1 to 13 are cross-sectional views illustrating a method of forming fine patterns according to an embodiment of the present disclosure.

Figure 2:
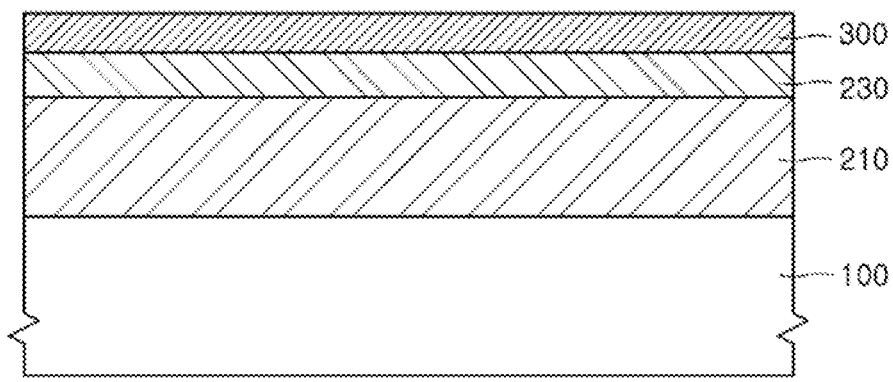

FIGS. 1 and 2 illustrate steps of forming a developable antireflective layer 301 and a cross-linked developable antireflective layer 300.

Referring to FIG. 1, an etch target layer 210 may be formed on a substrate 100. The substrate 100 may be a semiconductor substrate on which circuit elements constituting an integrated circuit are formed. The etch target layer 210 may be a conductive layer which is patterned in a subsequent process to form circuit interconnection lines. Alternatively, the etch target layer 210 may be patterned in a subsequent process to form etch target patterns which are used as etch masks when an underlying layer (not shown) is etched. Thus, the etch target layer 210 may be formed by depositing or coating a dielectric material or a conductive material. In some embodiments of the present disclosure, the etch target, layer 210 may be formed of a metal layer, a metal alloy layer or a metal nitride layer. The metal may include aluminum (Al), copper (Cu), tungsten (W) or titanium (Ti). Alternatively, the etch target layer 210 may be formed of a dielectric layer such as an interlayer insulation layer or a template layer. For example, the etch target layer 210 may be formed of a silicon oxide ($SiO_2$) layer.

A hard mask layer 230 may be formed on the etch target layer 210. The hard mask layer 230 may be patterned in a subsequent process, and the patterned hard mask layer may be used as an etch mask when the etch target layer 210 is etched. Accordingly, the hard mask layer 230 may be formed of a material layer having an etch selectivity with respect to the etch target layer 210. For example, the hard mask layer 230 may be formed to include a silicon nitride ($Si_3N_4$) layer or a silicon oxynitride (SiON) layer.

Figure 14:
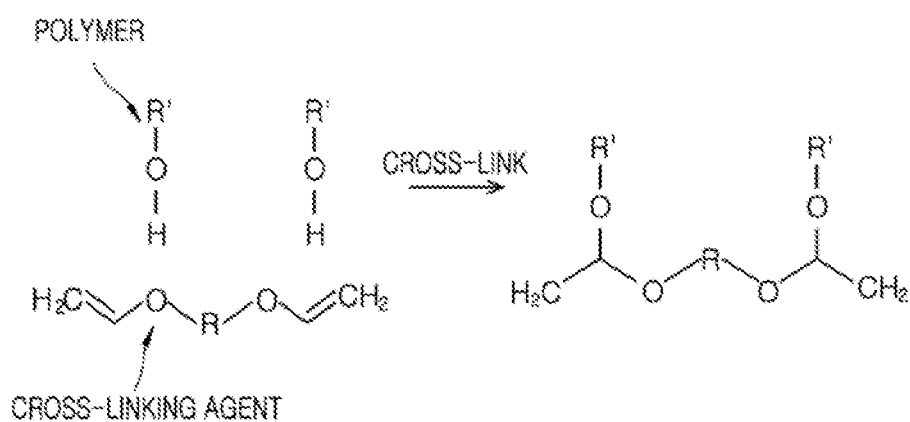
FIGS. 14 and 15 illustrate chemical formulas and molecular structures of a developable antireflective layer used in some embodiments of the present disclosure.

A developable antireflective layer 301 may be formed on an underlying structure including the etch target layer 210 and the hard mask layer 230. The developable antireflective layer 301 may be formed by dissolving an organic polymer material (R'—OH) and a cross-linking agent in a solvent to form a solution material (see FIG. 14) and by coating the solution material on the hard mask layer 230 with a spin coating process. The developable antireflective layer 301 may include an acid generator such as a photonic acid generator (PAG) or a thermal acid generator (TAG). The polymers in the developable antireflective layer 301 coated on the hard mask layer 230 may not be cross-linked when the solution material is coated on the hard mask layer 230 and may be soluble in a solvent. However, subsequently, the developable antireflective layer 301 may be annealed or baked at a high temperature over a room temperature to induce a cross-linking reaction between the polymers therein. As a result, a cross-linked developable antireflective layer 301 may be formed an the cross-linked polymers of the developable antireflective layer 301 may be insoluble in a solvent. If portions of the cross-linked developable antireflective layer 300 are exposed by an exposure step of a photolithography process, the exposed regions of the cross-linked developable antireflective layer 300 may be selectively removed using a developer. Thus, the developable antireflective layer 301 may be formed using a material known as a developable bottom antireflective coating (D-BARC) material. That the developable antireflective layer 301 is not formed using a typical bottom antireflective coating (BARC) material, which is not developable.

Figure 3:
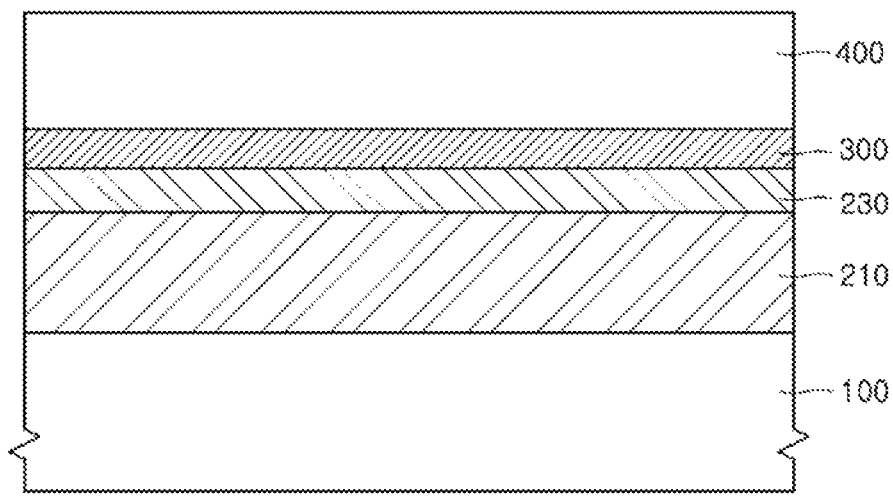

FIG. 3 illustrates a step of forming a photoresist layer 400.

Referring to FIG. 3, a resist material having negative tone development characteristics may be coated on the cross-linked developable antireflective layer 300 to form the photoresist layer 400. Subsequently, the photoresist layer 400 may be soft-baked to reduce the amount of solvent contained in the photoresist layer 400. The soft bake process may be performed at a temperature of about 90° C. to about 150° C. for about 30 seconds to about 90 seconds.

Figure 4:
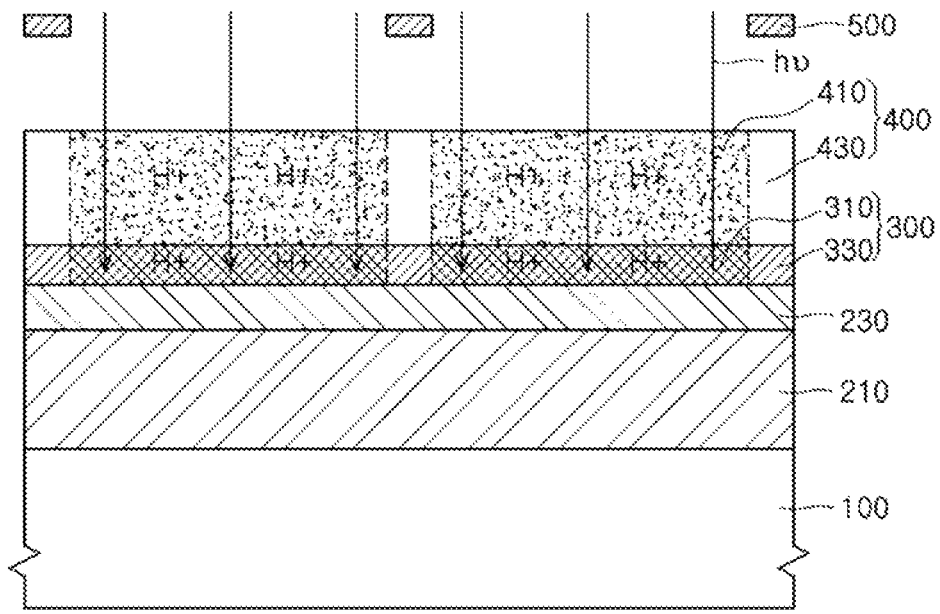

FIG. 4 illustrates a step of exposing the photoresist layer 400.

Referring to FIG. 4, the substrate including the photoresist layer 400 may be loaded into an exposure apparatus, under a photo mask 500. Light having an energy of "hυ" wherein, "h" denotes Planck's constant and "υ" denotes a frequency of light, may be irradiated onto the photo mask 500 to selectively expose portions of the photoresist layer 400. Thus, the photoresist layer 400 may include exposed regions 410 and non-exposed regions 430. During the exposure step, the light may also penetrate the photoresist layer 400 to reach the cross-linked developable antireflective layer 300. Thus, the cross-linked developable antireflective layer 300 may also include exposed regions 310 and non-exposed regions 330. The exposure step may be performed by using an ArF excimer laser as a light source, and the photoresist layer 400 may be formed of a material that is exposed to the ArF excimer laser. Alternatively, the exposure step may be performed using extreme ultraviolet (EUV) rays as a light source, and the photoresist layer 400 may be formed of a EUV resist material that is exposed to the EUV rays.

During the exposure step, a photonic acid generator, which is one of components of the photoresist layer 400, may react with the light penetrating the photoresist layer 400 to generate acid (H+) or acidic ions in the exposed regions 410 of the photoresist layer 400. The generated acid (H+) or acidic ions in the exposed regions 410 may change the exposed regions 410 from soluble state to insoluble state to a developer. Thus, the exposed regions 410 are in state of soluble in the developer.

The acid generator in the exposed regions 310 of the cross-linked developable antireflective layer 300 may also react with the light penetrating the cross-linked developable antireflective layer 300 to generate acids (H+) or acidic ions in the exposed regions 310 of the cross-linked developable antireflective layer 300. The acids (H+) or acidic ions in the exposed regions 310 may be act that bonds between the cross-linked polymers in the exposed regions 310 may be broken. Thus, the exposed regions 310 may be changed to a state of soluble in a developer, for example, a positive tone developer. If the exposed photoresist layer 400 is exposed to a developer, the exposed regions 410 of the photoresist layer 400 may exhibit a solubility which is different from the solubility of the non-exposed regions 430 of the photoresist layer 400. Thus, the the non-exposed regions 430 may be selectively dissolved in a developer and removed in a subsequent development step. Before the development step is performed, the exposed photoresist layer 400 may be subject to a post exposure bake (PEB) step. In the post exposure bake (PEB) step. The generated acid (H+) or acidic ions in the exposed regions 410 may be diffused to the exposed regions 310 of the cross-linked developable antireflective layer 300. Thus, the concentration of the generated acid (H+) or acidic ions in the exposed regions 310 of the cross-linked developable antireflective layer 300 may be increased.

The PEB step conditions may be different depending on the thickness and the composition of the photoresist layer 400. In some embodiments of the present disclosure, the PEB step may be performed at a temperature of about 80° C. to about 150° C. for about 30 seconds to about 90 seconds.

Figure 5:
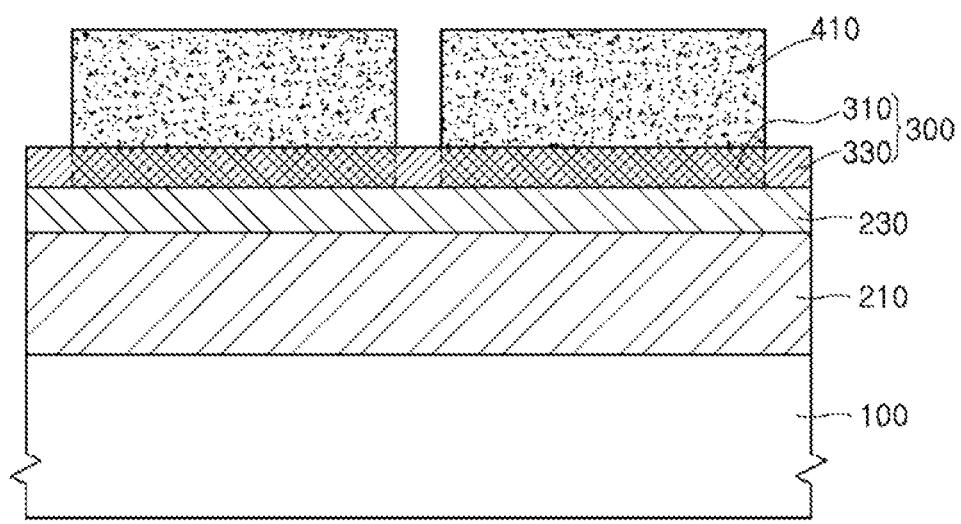

FIG. 5 illustrates a step of forming a photoresist pattern 410.

Referring to FIGS. 4 and 5, the non-exposed regions 430 of the exposed photoresist layer 400 may be selectively removed using a negative tone developer (NTD). The NTD may be an organic developer. For example, the organic developer may include any one solvent selected from the group consisting of ketones, esters, ethers, amids, hydrocarbons and combinations thereof. The ketone solvent may include acetone, 2-hexanone, 5-methyl-2-hexanone, 2-heptanone, 4-heptanone, 1-octanone, 2-octanone, 1-nonanone, 2-nonanone, di-isobutyl ketone (DIBK), cyclohexanone, methyl cyclohexanone, phenyl acetone, methyl ethyl ketone, or methyl isobutyl ketone. The ester solvent may include methyl acetate, butyl acetate, ethyl acetate, isopropyl acetate, amyl acetate, propylene glycol mono methyl ether acetate, ethylene glycol mono methyl ether acetate, di-ethylene glycol mono methyl ether acetate, di-ethylene glycol mono ethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, or propyl lactate. The ether solvent may include dioxane, tetrahydrofuran, or glycol ether. The glycol ether may include ethylene glycol mono methyl ether, propylene glycol mono methyl ether, ethylene glycol mono ethyl ether, propylene glycol mono ethyl ether, di-ethylene glycol mono methyl ether, tri-ethylene glycol mono ethyl ether, or methoxy methyl butanol. The amid solvent may include N-methyl-2-pyrrolidone, N,N-dimethyl acetamide, or N,N-dimethyl formamide. The hydrocarbon solvent may include aromatic hydrocarbons, for example, toluene or xylene. In some embodiments, the organic developer used as the NTD may include at least one selected from the group consisting of the ketone solvent, the ester solvent, the ether solvent, the amid solvent and the hydrocarbon solvent.

The NTD may be applied to the exposed photoresist layer 400 using a spin coating technique or a puddle coating technique and a rinse step may be applied to the developed photoresist layer 400 to selectively remove the non-exposed regions 430. That is, the exposed regions 410 may remain to constitute the photoresist pattern 410, exposing the non-exposed regions 330 of the developable antireflective layer 300. The non-exposed regions 330 of the developable antireflective layer 300 may still maintain the cross-linked state. Thus, the non-exposed regions 330 of the developable antireflective layer 300 may remain even after the non-exposed regions 430 of the photoresist layer 400 are removed by the NTD.

Figure 6:
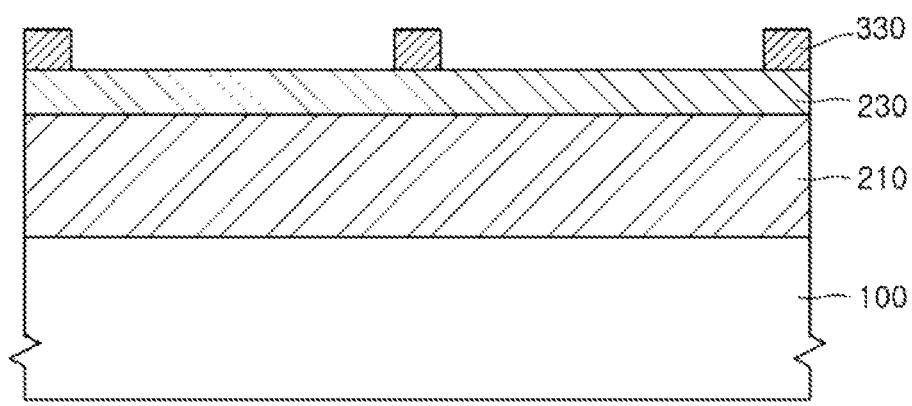

FIG. 6 illustrates a step of forming guide patterns 330.

Figure 15:
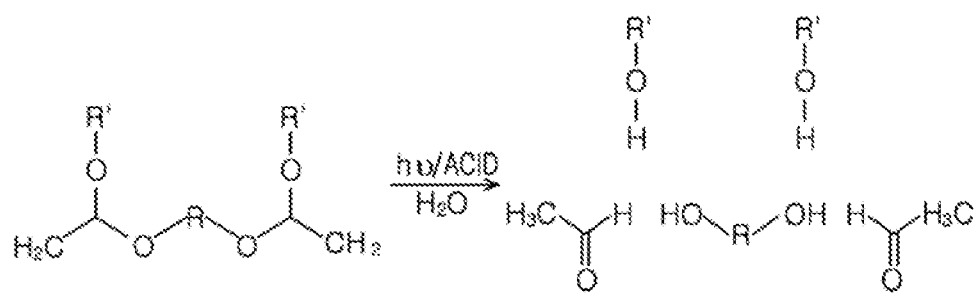

Referring to FIGS. 4 and 6, the exposed regions 310 of the developable antireflective layer 300 may be selectively removed. During the exposure step, the light may generate acid in the exposed regions 310 of the developable antireflective layer 300, and the acid may break bonds between the cross-linked polymers in the exposed regions 310 (see FIG. 15). Moreover, the acid generated in the exposed regions 310 may be activated by heat energy provided during a PEB step to break the bonds between the cross-linked polymers in the exposed regions 310. Accordingly, the exposed regions 310 may be readily dissolved in a solvent. In contrast, the non-exposed regions 330 may still maintain the cross-linked state since the light is not irradiated onto the non-exposed regions 330 during the exposure step. Thus, the solubility of the exposed regions 310 may be different from the solubility of the non-exposed regions 330 in a developer.

The exposed regions 310 of the developable antireflective layer 300 may be selectively removed using a positive tone developer (PTD). The PTD may be an alkaline developer. The alkaline developer may be a water solution containing an alkaline component. For example, the alkaline developer may be a tetra-methyl ammonium hydroxide (TMAH) solution. The TMAH solution may include a TMAH material of about 2 wt % to about 5 wt %.

The TMAH developer may be applied to the photoresist pattern 410 and the non-exposed regions 330 of the developable antireflective layer 300 using a spin coating method. As a result, the exposed regions 310 may be selectively removed to leave only the non-exposed regions 330 on the hard mask layer 230. The exposed regions 310 may be developed in the TMAH developer and the photoresist pattern 410 may be lift off and be removed. The non-exposed regions 330 remaining on the hard mask layer 230 may be formed as guide patterns. Even though the photoresist pattern 410 covers the exposed regions 310 of the developable antireflective layer 300, the TMAH developer of the PTD may penetrate to the exposed regions 310 through the edge portion of the photoresist pattern 410 and may dissolve the exposed regions 310 of the developable antireflective layer 300. Thus, the photoresist pattern 410 and the exposed regions 310 may be simultaneously removed using the PTD, or the photoresist pattern 410 may be lifted off after the exposed regions 310 are dissolved by the PTD. To accelerate the development step with the PTD, the photoresist pattern 410 may be treated by using an organic solvent including a thinner, before the development step is performed. A side surface portion of the photoresist pattern 410 may be stripped out to expose an edge portion of the exposed region 310 of the developable antireflective layer 300. Consequently, the penetration of the TMAH developer may be accelerated or the TMAH developer may directly contact the exposed portion of the exposed region 310. Thus, the removal of the exposed regions 310 may be accelerated.

Referring again to FIGS. 4, 5 and 6, the photoresist pattern 410 may prevent the guide patterns 330 from collapsing while the development step is performed using the PTD. This is due to the photoresist pattern 410 covering the exposed regions 310 to prevent the exposed regions 310 from being excessively developed by the PTD, such as the TMAH developer, during the development step. If the width of the guide patterns 330, that is, the non-exposed regions, is less than the width of the exposed regions 310 and the exposed regions 310 are directly exposed to the TMAH developer without the photoresist pattern 410, the guide patterns 330 may be damaged or may collapse from the TMAH developer during the development step. However, according to embodiments of the present disclosure, damage or collapse of the guide patterns 330 may be prevented during the development step since the photoresist pattern 410 overlaps with the exposed regions 310.

The photoresist pattern 410 may supply acid or acidic ions to the exposed regions 310 of the developable antireflective layer 300. Although the concentration of acid generated in the developable antireflective layer 300 during the exposure step is low, the acid or the acidic ions generated in the exposed regions 410, that is, the photoresist patterns, of the photoresist layer 400 may diffuse into the exposed regions 310 to increase the acid concentration of the exposed regions 310. This diffusion of the acid or the acidic ions may be induced by heat which is generated during the PEB step. If the acid concentration of the exposed regions 310 increases, the exposed regions 310 may be cleanly removed without leaving any residue or trail of the exposed regions 310 during the development step.

The development step with the NTD may be followed by the development step with the PTD. Since no processes are performed between the development step with the NTD and the development step with the PTD, the development step with the NTD and the development step with the PTD may be performed in succession using an in-situ process on the same apparatus. Thus, the number of process steps or the process time required for fabrication may be reduced. A rinse step may be performed after the development step with the PTD.

Figure 7:
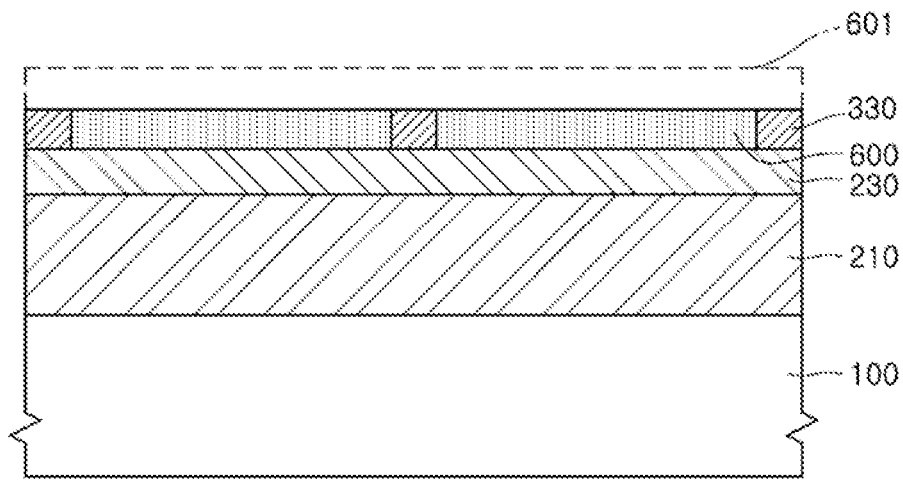
Figure 8:
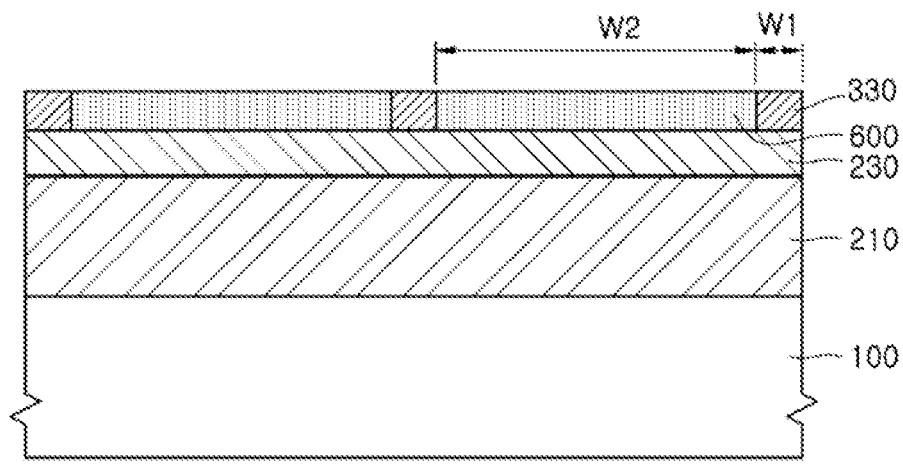

FIGS. 7 and 8 illustrate a step of forming neutral layers 600.

Referring to FIG. 7, the neutral layers 600 may be formed in spaces between the guide patterns 330. The guide patterns 330 may have widths W1 which are less than the distances between the guide patterns 330 and may expose portions of the underlying hard mask layer 230. Thus, the neutral layers 600 may be formed to cover the exposed portions of the hard mask layer 230 and to expose top surfaces of the guide patterns 330. The neutral layers 600 may induce polymer blocks, constituting a BCP layer formed in a subsequent process, to phase-separate into block domains which are alternately and repeatedly ordered to form cylindrical shapes or lamellar shapes. That is, each of the neutral layers 600 may function as an orientation control layer that controls the orientation of the polymer blocks in the BCP layer to alternately and repeatedly array the block domains when the BCP layer is phase-separated.

The neutral layers 600 may be formed of a material layer exhibiting similar affinity to all of the polymer blocks of the BCP layer. For example, the neutral layers 600 may be formed to include a copolymer material containing polymer blocks "A" and polymer blocks "B", which are randomly copolymerized. In some embodiments of the present disclosure, if the BCP layer is formed of a polystyrene-poly(meta methyl acrylate) block copolymer (PS-b-PMMA) material the neutral layers 600 may be formed to include a copolymer material containing PS blocks and PMMA blocks, that is, a PS-r-PMMA material.

To form the neutral layers 600, one or more of various random copolymer materials, such as a PS-r-PMMA material, may be used as a polymer material having terminal hydroxyl groups (—OH groups), and the random copolymer material may be dissolved in a solvent to form a neutral solution. The neutral solution may then be coated on the top surfaces of the guide patterns 330 and the exposed portions of the hard mask layer 230 to form a coating layer 601. Subsequently, the coating layer 601 may be annealed to bond the hydroxyl groups (—OH groups) in the coating layer 601 with the hard mask layer 230. The coating layer 601 on the top surfaces of the guide patterns 330 does not bond with the hard mask layer 230. Thus, the coating layer 601 on the top surfaces of the guide patterns 330 may be removed using a solvent, thereby forming neutral layers 600 that cover only the hard mask layer 230. The hard mask layer 230 may be formed of a material providing surface bonds which are capable of bonding with the hydroxyl groups (—OH groups) in the coating layer 601. For example, the hard mask layer 230 may be formed of a material including silicon. In some embodiments of the present disclosure, the hard mask layer 230 may be formed of a silicon oxynitride layer. As described above, the neutral layers 600 may be formed in spaces between the guide patterns 330 using a polymer brush process. Since the guide patterns 330, that is, the cross-linked developable anti-reflective layer 300, have an organic polymer structure, chemical bonding between the guide patterns 330 and the hydroxyl groups (—OH groups) in the coating layer 601 may be suppressed. Thus, the coating layer 601 on the top surfaces of the guide patterns 330 may be removed by the polymer brush process, as described above. As a result of the polymer brush process, each of the neutral layers 600 may be formed to have a top surface that is substantially coplanar with the top surfaces of the guide patterns 330. Accordingly, a self-alignment failure of polymer blocks constituting a BCP layer, which is formed on the neutral layers 600 and the guide patterns 330 in a subsequent process, may be prevented due to the presence of the neutral layers 600 while the BCP layer is phase-separated by an annealing process.

Referring to FIG. 8, each of the guide patterns 330 may be formed to have a width W1 which is less than a width W2 of each of the neutral layers 600. The guide patterns 330 may induce any one kind of polymer blocks, among two or more distinct polymer blocks constituting a BCP layer, to be formed on the guide patterns 330 when the BCP layer is phase-separated. Thus, the two or more distinct polymer blocks in the BCP layer may be alternately and repeatedly arrayed on the neutral layers 600 between the guide patterns 330 while the BCP layer is phase-separated in a subsequent process.

Figure 9:
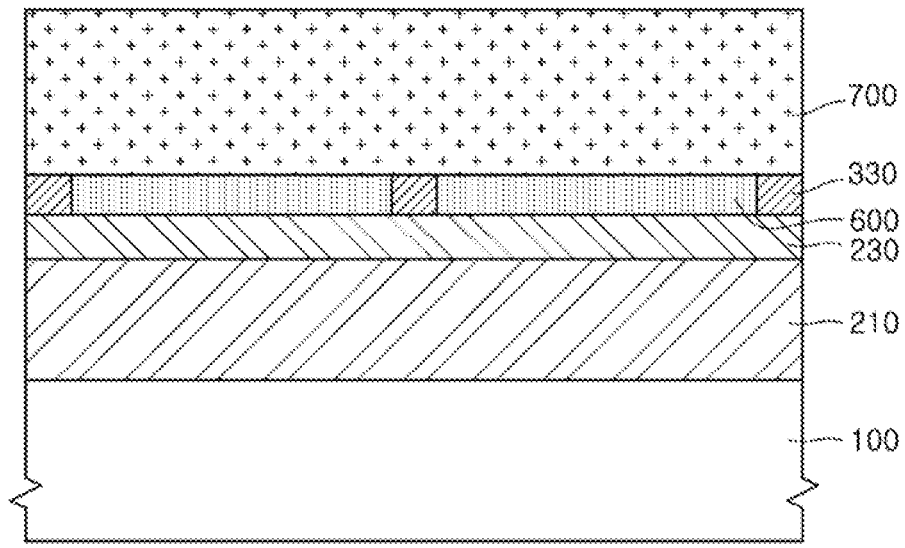

FIG. 9 illustrates a step of forming a BCP layer 700.

Referring to FIG. 9, a self-assembling BCP material may be coated on the guide patterns 330 and the neutral layers 600 to form a BCP layer 700 covering the guide patterns 330 and the neutral layers 600. The BCP layer 700 may be formed of a PS-b-PMMA material or a polystyrene-poly(di methyl siloxane) (PS-PDMS) block copolymer material. When the BCP layer 700 is formed of a PS-b-PMMA material including PS blocks and PMMA blocks, the volume ratio of the PS blocks to the PMMA blocks may be controlled to be from about 7:3 to about 5:5. The volume ratio of the PS blocks to the PMMA blocks or the molecular weights of the PS block and the PMMA block may be appropriately controlled according the process scheme. For example, the PS-b-PMMA material may have a PS block content of about 50 vol. % to about 80 vol. % and a PMMA block content of about 20 vol. % to about 50 vol. %.

Figure 16:
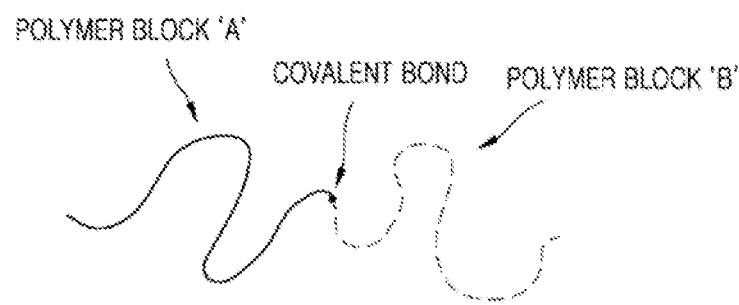
FIGS. 16, 17 and 18 are schematic views illustrating phase separation of block copolymer (BCP) layers used in some embodiments of the present disclosure.
Figure 17:
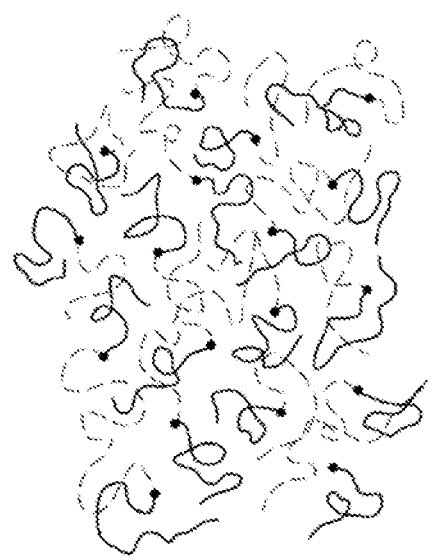

The BCP layer 700 may include a functional polymer material with polymer blocks having two or more distinct structures that are covalently bonded to constitute a single block copolymer, as illustrated in FIG. 16. As further illustrated in FIG. 16, a single block copolymer of the BCP layer 700 may have a chain shape where a polymer block A and a polymer block B are connected to each other by a covalent bond through a connection point. The BCP layer 700 may be coated in a homogeneous phase, as illustrated in FIG. 17.

Figure 18:
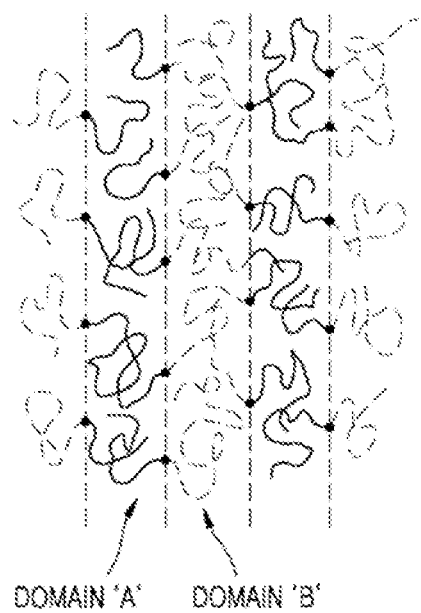

The polymer blocks in the BCP layer 700 may form distinct structures since they have different miscibility and different solubilities due to their differing chemical structures. That is, the polymer blocks having distinct structures are immiscible with each other at certain temperatures. Thus, the BCP layer 700 may be phase-separated using an annealing process to provide a self-aligned structure, as illustrated in FIG. 18. That is, the BCP layer 700 having a homogeneous phase may be phase-separated by an annealing process into a domain "A" in which polymer blocks "A" are arranged and a domain "B" in which polymer blocks "B" are arranged. As such, the polymer blocks of the BCP layer 700 may be phase-separated, or selectively dissolved in a liquid state or in a solid state, to form a self-assembled structure.

Forming a nano-scale structure having a specific shape through self-assembly of the BCP layer 700 may be influenced by the physical properties and/or chemical properties of the polymer blocks of the BCP layer 700. When a BCP layer consisting of two distinct polymer blocks is self-assembled on a substrate, the self-assembled structure of the BCP layer may be formed in a three dimensional cubic shape, a three dimensional double helix shape, a two dimensional hexagonal packed column shape, or a two dimensional lamella shape, depending on the volume ratio of the polymer blocks constituting the BCP layer, the annealing temperature for phase separation of the BCP layer, and the molecule size of the polymer blocks constituting the BCP layer.

In some embodiments of the present disclosure, the BCP layer 700 may be formed of polybutadiene-polybutylmeyhacrylate block copolymer, polybutadiene-polydimethylsiloxane block copolymer, polybutadiene-polymethylmethacrylate block copolymer, polybutadienepolyvinylpyridine block copolymer, polybutylacrylate-polymethylmethacrylate block copolymer, polybutylacrylate-polyvinylpyridine block copolymer, polyisoprene-polyvinylpyridine block copolymer, polyisoprene-polymethylmethacrylate block copolymer, polyhexylacrylatepolyvinylpyridine block copolymer, polyisobutylene-polybutlmethacrylate block copolymer, polyisbutylene-polymethylmethacrylate block copolymer, polyisbutylene-polybutylmethacrylate block copolymer, polyisobutylenepolydimethylsiloxane block copolymer, polybutylmethacrylatepolybutylacrylate block copolymer, polyethylethylene-polymethylmethacrylate block copolymer, polystyrene-polybutylmethacrylate block copolymer, polystyrene-polybutadiene block copolymer, polystyrene-polyisoprene block copolymer, polystyrene-polydimethylsiloxane block copolymer, polystyrene-polyvinylpyridine block copolymer, polyethylethylene-polyvinylpyridine block copolymer, polyethylene-polyvinylpyridine block copolymer, polyvinylpyridinepolymethlmethacrylate block copolymer, polyethyleneoxide-polyisoprene block copolymer, polyethyleneoxide-polybutadiene block copolymer, polyethyleneoxide-polystyrene block copolymer, polyethyleneoxidepolymethylmethacrylate block copolymer, polyethyleneoxide-polydimethylsiloxane block copolymer, or polystyrene-polyethyleneox de block copolymer.

Figure 10:
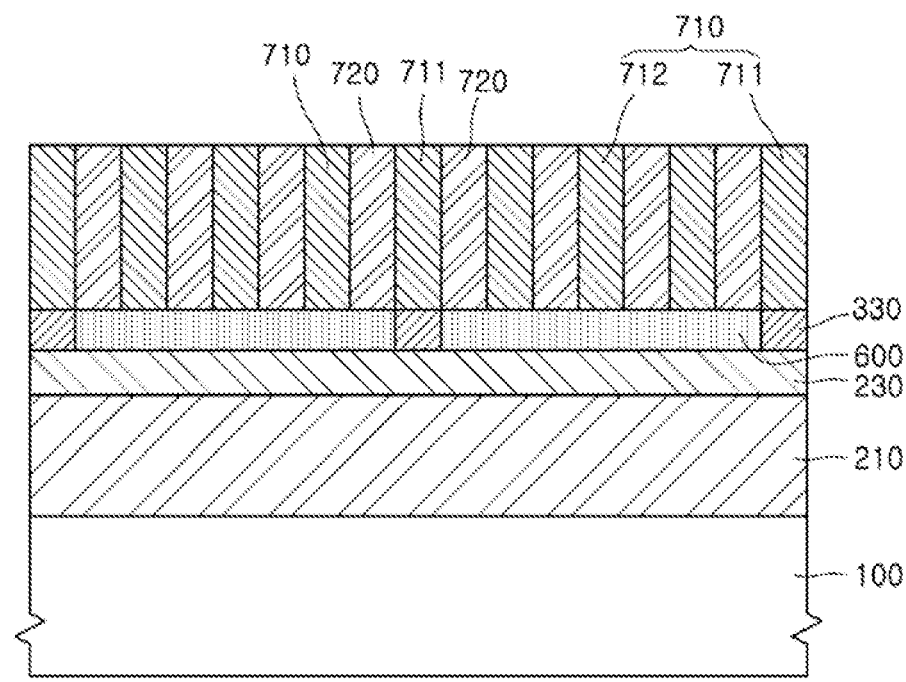

FIG. 10 illustrates a step of forming first domains 710 of polymeric blocks and second domains 720 of polymeric blocks.

Referring to FIG. 10, the BCP layer (700 of FIG. 9) may be phase-separated using an annealing process to form the first domains 710 of polymeric blocks and the second domains 720 of polymeric blocks, which are alternately and repeatedly arrayed. That is, the BCP layer 700 having a homogeneous phase illustrated in FIG. 17 may be phase-separated into the first polymer block domains 710, corresponding to the domains "A" of FIG. 18 and the second polymer block domains 720, corresponding to the domains "B" of FIG. 18, by an annealing process. In some embodiments of the present disclosure, the first polymer block domains 710 or the second polymer block domains 720 may be formed to have circular pillar shapes. Alternatively, the first and second polymer block domains 710 and 720 may be formed to have lamellar shapes. The annealing process for phase-separation of the BCP layer 700 may be a thermal annealing process that is performed at a temperature of about 100° C. to about 190° C. for less than one hour to about one hundred hours. Alternatively, the thermal annealing process may be performed for several minutes. As a result of the annealing process, the first polymer block domains 710 and the second polymer block domains 720 may rearrange and exist in separate phases, as illustrated in FIG. 18.

If the BCP layer 700 is formed of a PS-b-PMMA material, the developable antireflective layer or the developable antireflective material used for forming the guide patterns 330 may be formed of a material that has greater affinity to either the PS block component or the PMMA block component, unlike the neutral layers 600. For example, the developable antireflective layer or the developable antireflective material used for forming the guide patterns 330 may be formed of a material that has greater affinity to the PMMA block component than the PS block component. Thus, the guide patterns 330 may bond or align with the first polymer block domains 710 for example, PMMA blocks, and repel, or simply not attract, the second polymer block domains 720. That is, during the annealing process, only the PMMA blocks of the BCP layer 700 may align or bond with the guide patterns 330 to form first domains 711 constituting the first polymer block domains 710. As described above, each of the neutral layers 600 between the guide patterns 330 may have substantially the same affinity to all of the polymer blocks constituting the BCP layer 700, that is, the PS blocks and the PMMA blocks. None of the PS block components or the PMMA block components have a greater tendency to align or bond with the neutral layers 600. Thus, the first polymer block domains 710 and the second polymer block domains 720 may be alternately and repeatedly be arrayed on each of the neutral layers 600. Since the first domains 711 of the first polymer block domains 710 are formed on the guide patterns 330, the second polymer block domains 720 may be located on of the top surface of the neutral layers 600 and contact the first domains 711 on the guide patterns 330. If the width ("W2" of FIG. 8) of each of the neutral layers 600 is set to an odd multiple of the width ("W1" of FIG. 8) of each of the guide patterns 330, such as equal to or greater than "3", the width of each of the first polymer block domains 710 may be equal to the width of each of the second polymer block domains 720. That is, if the width ("W2" of FIG. 8) of each of the neutral layers 600 is set to "W1×(2N−1)", wherein, "N" denotes a natural number which is equal to or greater than 2, the width of each of the first polymer block domains 710 may be equal to the width of each of the second polymer block domains 720.

Figure 11:
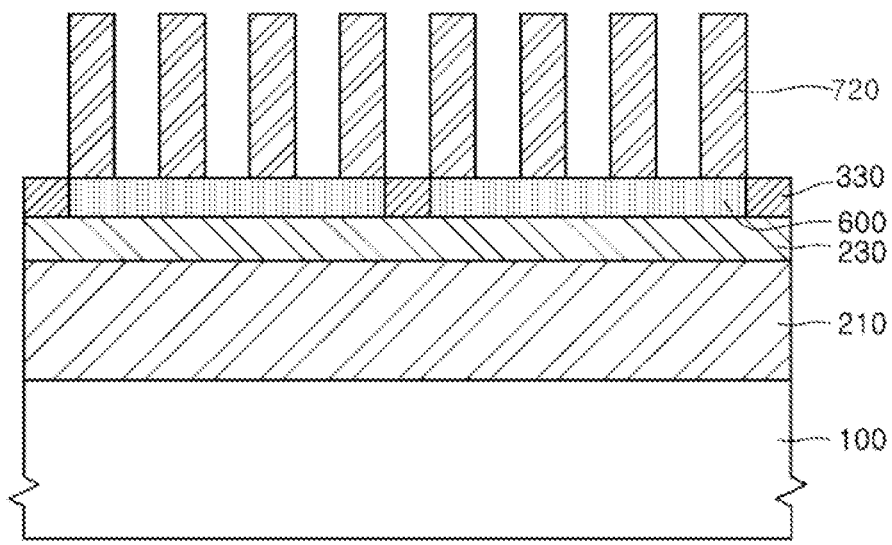

FIG. 11 illustrates a step of removing the first polymer block domains 710.

Referring to FIG. 11, the first polymer block domains 710 may be selectively removed. Specifically, the first polymer block domains 710 may be selectively removed using a wet etch process that employs a solvent suitable for selectively dissolving the PMMA block component in the first polymer block domains 710 as an etchant. Alternatively, the first polymer block domains 710 may be selectively removed using a dry etch process. If the first polymer block domains 710 are selectively removed, cavities having a cylindrical shape or a trench shape may be provided between the second polymer block domains 720.

Figure 12:
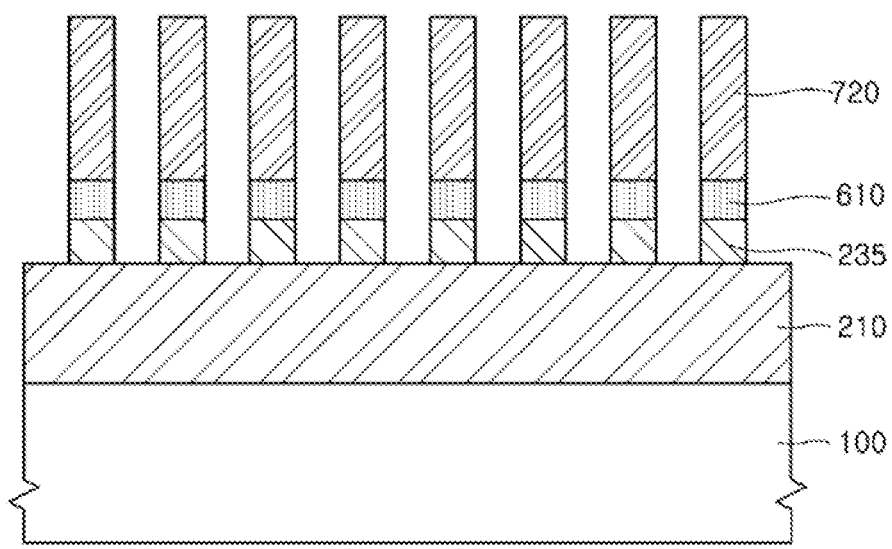

FIG. 12 illustrates a step of forming hard mask patterns 235.

Referring to FIG. 12, using the second polymer block domains 720 as etch masks, the neutral layers 600 and the hard mask layer 230 may be successively etched to form neutral patterns 610, under the second polymer block domains 720, and hard mask patterns 235, under the neutral patterns 610. As a result, the pattern shape of the second polymer block domains 720 may be transferred onto the hard mask layer 230, and the hard mask patterns 235 may be formed to have substantially the same pattern shape as the second polymer block domains 720. The hard mask patterns 235 may be used as etch masks in a subsequent etch process.

Figure 13:
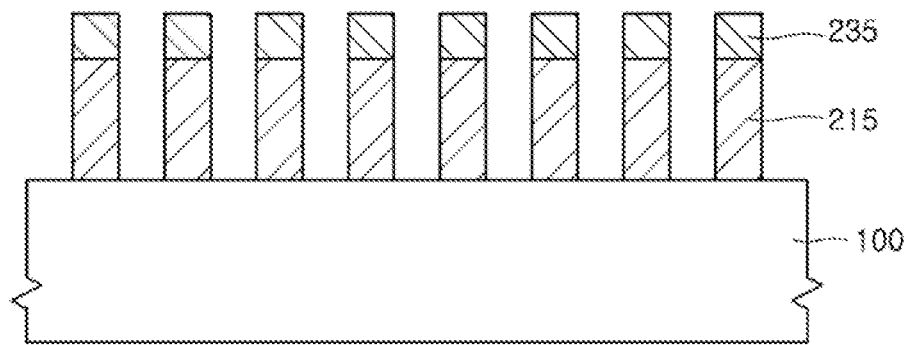

FIG. 13 illustrates a step of forming etch target patterns 215.

Referring to FIG. 13, portions of the etch target layer 210 (shown in FIG. 12) exposed by the hard mask patterns 235 may be etched to form an array of etch target patterns 215. In some embodiments of the present disclosure, the second polymer block domains 720 and the neutral patterns 610 may be removed before the exposed portions of the etch target layer 210 are etched.

According to the embodiments described above, the guide patterns 330 may be formed to include a developable antireflective material having greater affinity to the PMMA block component of the BCP layer 700 than to the PS block component of the BCP layer 700. Thus, fine patterns can be formed using phase separation of the BCP layer 700.

FIGS. 19 to 26 are perspective views illustrating a method of forming a line and space array pattern according to an embodiment of the present disclosure.

Figure 19:
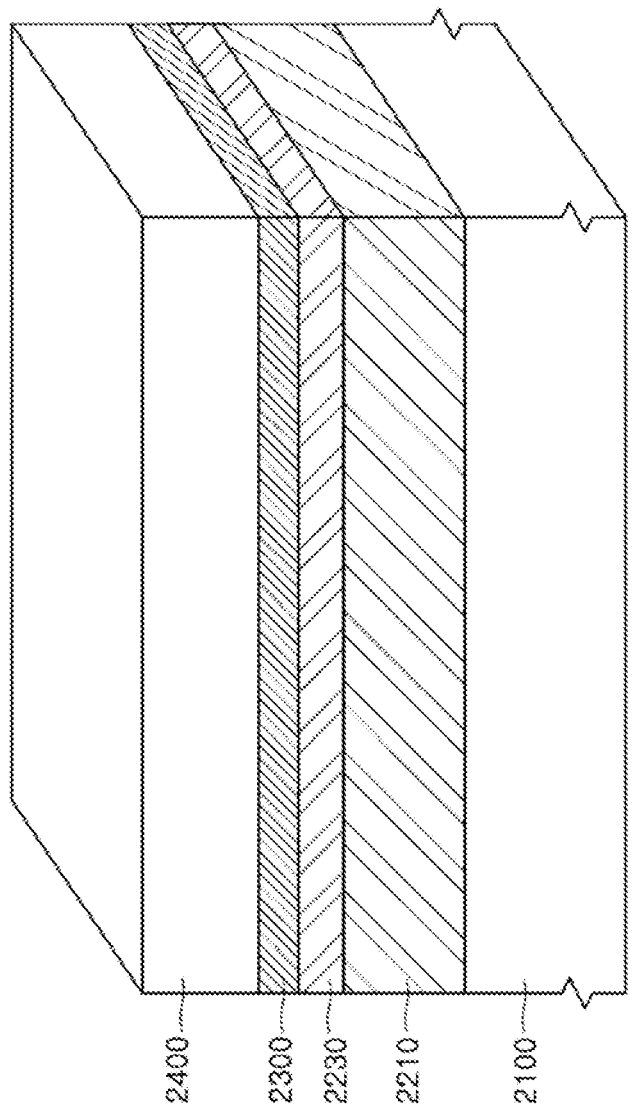
FIGS. 19 to 26 are perspective views illustrating a method of forming a line and space array pattern according to an embodiment of the present disclosure.

FIG. 19 illustrates a step of forming a stacked structure of a cross-linked developable antireflective layer 2300 and a photoresist layer 2400.

Referring to FIG. 19, an etch target layer 2210 may be formed on a substrate 2100. The substrate 2100 may be a semiconductor substrate on which circuit elements constituting an integrated circuit are formed. The etch target layer 2210 may he a conductive layer which is patterned in a subsequent process to form circuit interconnection lines. Alternatively, the etch target layer 2210 may be patterned in a subsequent process to form etch target patterns which are used as etch masks when an underlying layer (not shown) is etched. Thus, the etch target layer 2210 may be formed by depositing or coating a dielectric material or a conductive material. In some embodiments of the present disclosure, the etch target layer 2210 may be formed of a dielectric layer used as a template layer. For example, the etch target layer 2210 may be formed to include a silicon oxide ($SiO_2$) layer.

A hard mask layer 2230 may be formed on the etch target layer 2210. The hard mask layer 2230 may be formed of a material having an etch selectivity with respect to the etch target layer 2210. For example, the hard mask layer 2230 may be formed to include a silicon nitride ($Si_3N_4$) layer or a silicon oxynitride (SiON) layer. That is, the hard mask layer 2230 may be formed of a material that is different from the etch target layer 2210 to obtain etch selectivity with respect to the etch target layer 2210.

The cross-linked developable antireflective layer 2300 may be formed on an underlying structure including the etch target layer 2210 and the hard mask layer 2230. The cross-linked developable antireflective layer 2300 may be formed by dissolving an organic polymer material (R'—H) and a cross-linking agent in a solvent to form a solution material, such as a developable antireflective material (see FIG. 14). The solution material may then be coated on the hard mask layer 2230 with a spin coating process and, then a cross-linking reaction may be induced in the coated solution material. The cross-linked developable antireflective layer 2300 may be unsoluble to a developer, for example PTD. The cross-linked developable antireflective layer 2300 may be formed of a developable bottom antireflective coating (D-BARC) material. That is, the cross-linked developable antireflective layer 2300 may be not formed using a typical bottom antireflective coating (BARC) material, which may be not developable to the PTD. The photoresist layer 2400 may then be formed by coating a photoresist material for negative tone development on the cross-linked developable antireflective layer 2300.

Figure 20:
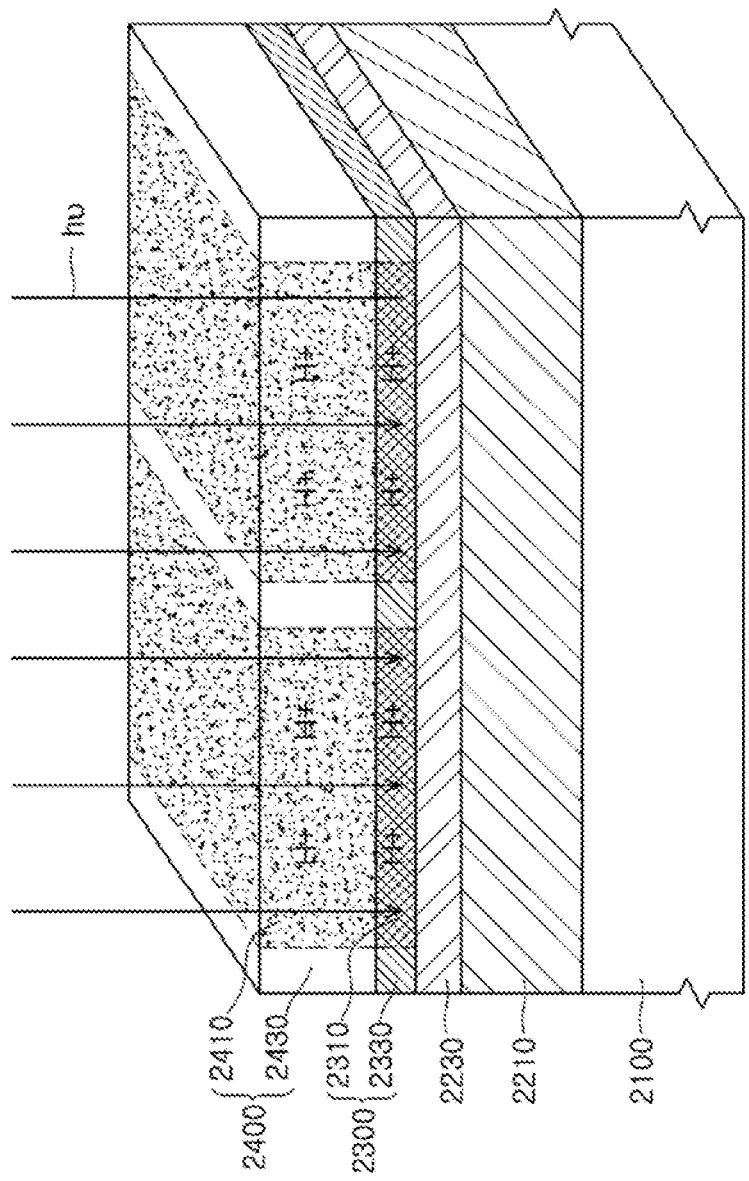

FIG. 20 illustrates a step of exposing the photoresist layer 2400.

Referring to FIG. 20, the substrate including the photoresist layer 2400 may be loaded into an exposure apparatus under a photo mask (not shown). Light having an energy of "hυ", wherein "h" denotes Planck's constant and "υ" denotes a frequency of light, may be irradiated onto the photo mask to selectively expose portions of the photoresist layer 2400. Thus, the photoresist layer 2400 may include exposed regions 2410 and non-exposed regions 2430. The exposed regions 2410 may be formed to create lines that are parallel to each other. During the exposure step, the light may also penetrate the photoresist layer 2400 to reach the cross-linked developable antireflective layer 2300. Thus, the cross-linked developable antireflective layer 2300 may also include exposed regions 2310 and non-exposed regions 2330.

During the exposure step, an acid generator in the exposed regions 2410 of the photoresist layer 2400 may react with the light penetrating the photoresist layer 2400 to generate acids (H+) or acidic ions. In addition, an acid generator in the exposed regions 2310 of the cross-linked developable antireflective layer 2300 may also react with the light penetrating the the cross-linked developable antireflective layer 2300 to generate acids (H+) or acidic ions. As a result, the exposed regions 2410 of the photoresist layer 2400 may have a different solubility than the non-exposed regions 2430 of the photoresist layer 2400. Accordingly, the non-exposed regions 2430 of the photoresist layer 2400 may be in soluble state to a developer and the exposed regions 2410 may be changed to be in unsoluble state to the developer in a subsequent development step. Before the development step is performed, the exposed photoresist layer 2400 may be subject to a post exposure bake (PEB) step. The PEB step conditions may differ based on the thickness and composition of the photoresist layer 2400. In some embodiments of the present disclosure, the PEB step may be performed at a temperature of about 80° C. to about 150° C. for about 30 seconds to about 90 seconds.

Figure 21:
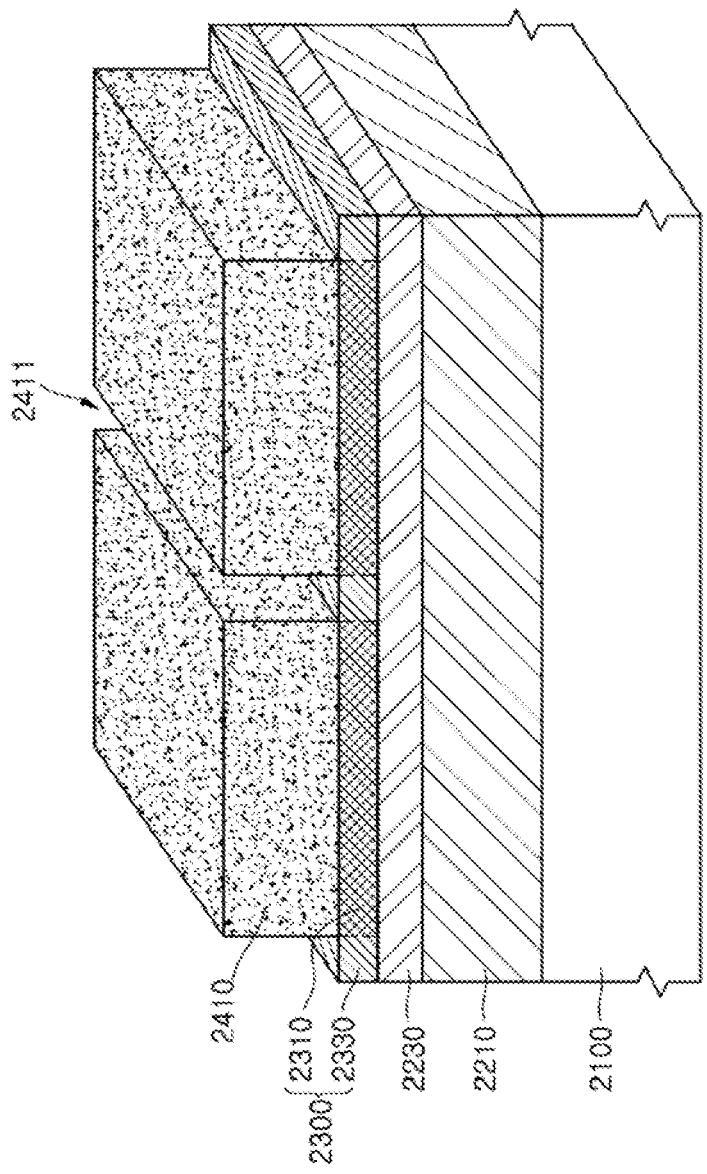

FIG. 21 illustrates a step of forming a photoresist pattern 2410.

Referring to FIG. 21, the non-exposed regions 2430 of the exposed photoresist layer 2400 may be selectively removed using a negative tone developer (NTD). The NTD may be an organic developer.

The NTD may be applied to the exposed photoresist layer 2400 using a spin coating technique or a puddle coating technique. As a result, the non-exposed regions 2430 may be selectively removed to form a photoresist pattern 2410 that provides linearly shaped trenches 2411. During the development step, the exposed regions 2410 of the photoresist layer 2400 may remain to constitute the photoresist pattern 2410 and to expose the non-exposed regions 2330 of the developable antireflective layer 2300. The non-exposed regions 2330 of the developable antireflective layer 2300 may remain in the cross-linked state. Thus, the non-exposed regions 2330 of the developable antireflective layer 2300 may remain even after the non-exposed regions 2430 of the photoresist layer 2400 are removed by the NTD.

Figure 22:
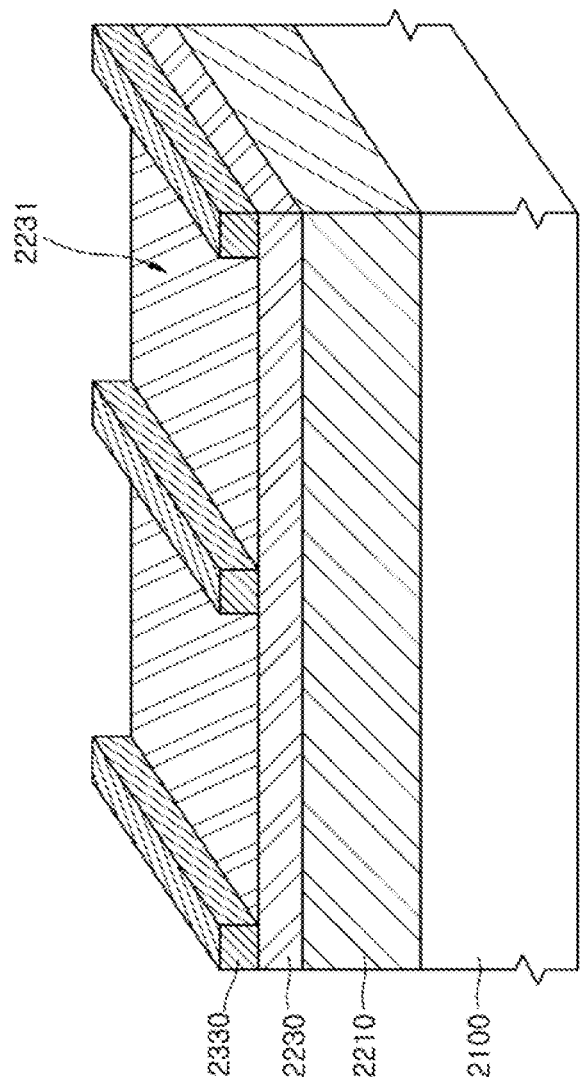

FIG. 22 illustrates a step of forming guide patterns 2330.

Referring to FIG. 22, the exposed regions (2310 of FIG. 21) of the developable antireflective layer 2300 may be selectively removed. During the exposure step, the light may generate acid in the exposed regions 2310 of the developable antireflective layer 2300, and the acid may break the bonds between the cross-linked polymers in the exposed regions 2310 (see FIG. 15). Moreover, the acid generated in the exposed regions 2310 may be activated by heat energy provided during a PEB step to break the bonds between the cross-linked polymers in the exposed regions 2310. Accordingly, the exposed regions 2310 may be readily dissolved to a developer, for example, to a PTD. In contrast, the non-exposed regions 2330 may still maintain the cross-linked state since light is not irradiated onto the non-exposed regions 2330 during the exposure step. Thus, the solubility of the exposed regions 2310 may be different from the solubility of the non-exposed regions 2330 in a developer.

The exposed regions 2310 of the developable antireflective layer 2300 may be selectively removed using a positive tone developer (PTD). The PTD may be an alkaline developer. The alkaline developer may be a water solution containing an alkaline component. For example, the alkaline developer may be a tetra-methyl ammonium hydroxide (TMAH) solution. The TMAH solution may include a TMAH material of about 2 wt % to about 5 wt %.

The TMAH developer may be applied onto the photoresist pattern 2410 and the exposed regions 2310 of the developable antireflective layer 2300 using a spin coating method. As a result, the exposed regions 2310 may be selectively removed to leave only the non-exposed regions 2330 on the hard mask layer 2230. The non-exposed regions 2330 remaining on the hard mask layer 2230 may function as the guide patterns. Even though the photoresist pattern 2410 covers the exposed regions 2310 of the developable antireflective layer 2300, the TMAH developer of the PTD may penetrate to the exposed regions 2310 through the edge portion of the photoresist pattern 2410 and may dissolve the exposed regions 2310 of the developable antireflective layer 2300. Thus, the photoresist pattern 2410 and the exposed regions 2310 may be simultaneously removed using the PTD, or the photoresist pattern 2410 may be lifted off after the exposed regions 2310 are removed by the PTD.

The development step with the NTD may be followed by a development step with a PTD. Since no processes are performed between the development step with the NTD and the development step with the PTD, the development step with the NTD and the development step with the PTD may be performed in succession using an in-situ process in a single fabrication apparatus. Thus, the number of process steps or the process time required for fabrication may be reduced. A rinse step may be performed after the development step with the PTD.

Figure 23:
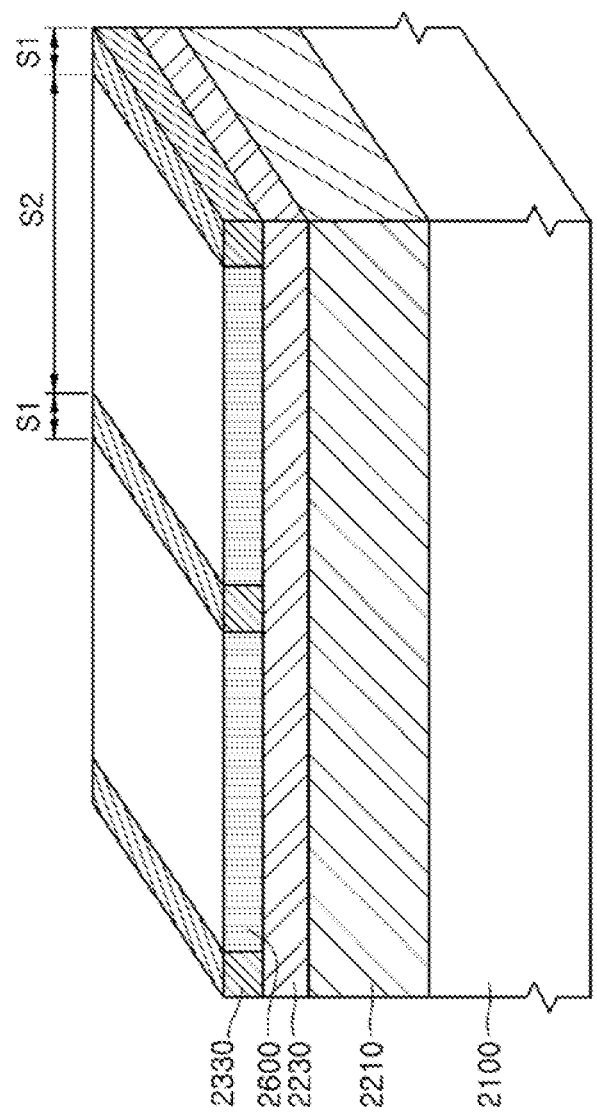

FIG. 23 illustrates a step of forming neutral layers 2600.

Referring to FIG. 23, the neutral layers 2600 may be formed in spaces between the guide patterns 2330. The guide patterns 2330 may have widths which are less than the distances between the guide patterns 2330 and may expose portions of the underlying hard mask layer 2230. Thus, the neutral layers 2600 may be formed to cover the exposed portions of the hard mask layer 2230 and to expose top surfaces of the guide patterns 2330. The neutral layers 2600 may induce phase separation in polymer blocks constituting a BCP layer, which will be formed in a subsequent process. This phase separation may result in the formation of block domains that are alternately and repeatedly ordered. That is, each of the neutral layers 2600 may function as an orientation control layer that controls the orientation of the polymer blocks in the BCP layer so that they are alternately and repeatedly arrayed when the BCP layer is phase-separated.

The neutral layers 2600 may be formed of a material layer exhibiting similar values of affinity to all of the polymer blocks of the BCP layer. For example, the neutral layers 2600 may include a random copolymer material containing polymer blocks "A" and polymer blocks "B", which are randomly copolymerized. In some embodiments of the present disclosure, if the BCP layer is formed of a polystyrene-poly(meta methyl acrylate) block copolymer (PS-b-PMMA) material, the neutral layers 2600 may be formed to include a random copolymer material containing PS blocks and PMMA blocks, that is, a PS-r-PMMA material.

To form the neutral layers 2600, a copolymer material such as a PS-r-PMMA material may be prepared with hydroxyl groups (—OH groups) acting as terminal groups, and the copolymer material may be dissolved in a solvent to form a neutral solution. The neutral solution may then be coated on the top surfaces of the guide patterns 2330 and the exposed portions of the hard mask layer 2230 to form a coating layer. Subsequently, the coating layer may be annealed to bond the hydroxyl groups (—OH groups) in the coating layer with the hard mask layer 2230. The coating layer on the top surfaces of the guide patterns 2330 does not bond with the hard mask layer 2230. Thus, the coating layer on the top surfaces of the guide patterns 2330 may be removed using a solvent, thereby forming the neutral layers 2600 that cover only the hard mask layer 2230.

Each of the guide patterns 2330 may be formed to have a line width S1 which is less than the line width S2 of each of the neutral layers 2600. For example, the line width S2 of each of the neutral layers 2600 may be set to be "S1×(2N−1)" wherein, "N" denotes a natural number which is equal to or greater than 2.

Figure 24:
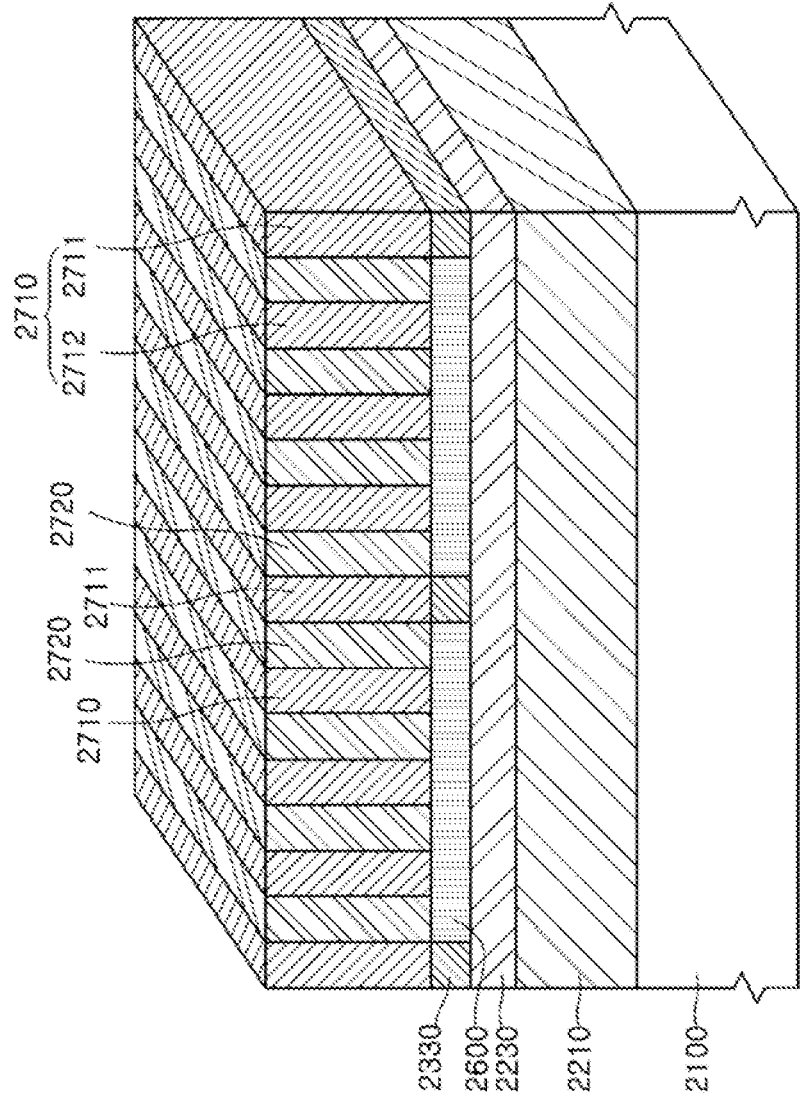

FIG. 24 illustrates a step of forming first polymer block domains 2710 and second polymer block domains 2720.

Referring to FIG. 24, a self-assembling BCP material may be coated on the guide patterns 2330 and the neutral layers 2600. The coated BCP material may be phase-separated using an annealing process to form the first polymer block domains 2710 and the second polymer block domains 2720, which are alternately and repeatedly arrayed. That is, the coated BCP material having a homogeneous phase, as illustrated in FIG. 17, may be phase-separated by an annealing process into the first polymer block domains 2710, corresponding to the domains "A" of FIG. 18, and the second polymer block domains 2720, corresponding to the domains "B" of FIG. 18. The first polymer block domains 2710 and the second polymer block domains 2720 may be alternately and repeatedly arrayed to provide lamellar shapes. The annealing process for phase-separation of the coated BCP material may be a thermal annealing process that is performed at a temperature of about 100° C. to about 190° C. for about one hour to about one hundred hours. As a result of the annealing process, the first polymer block domains 2710 and the second polymer block domains 2720 may be rearranged and phase-separated, as illustrated in FIG. 18.

If the BCP material is formed of a PS-b-PMMA material, the developable antireflective layer or the developable antireflective material used in the guide patterns 2330 may have greater affinity to either the PS block component or the PMMA block component, unlike the neutral layers 2600. For example, the developable antireflective layer or the developable antireflective material used in the guide patterns 2330 may have greater affinity to the PMMA block components than to the PS block component. Thus, the guide patterns 2330 may align with the first polymer block domains 2710, for example, PMMA blocks, rather than the second polymer block domains 2720. That is, during the annealing process, only the PMMA blocks of the BCP material may arrange themselves on the guide patterns 2330 to form first domains 2711 of the first polymer block domains 2710. As described above, each of the neutral layers 2600 between the guide patterns 2330 may have substantially the same affinity to all of the polymer blocks, of the BCP material, that is, the PS blocks and the PMMA blocks. Thus, neither the PS nor PMMA block components bond or align with the neutral layers 2600. Therefore, first polymer block domains 2710 and the second polymer block domains 2720 may be alternately and repeatedly arrayed on each of the neutral layers 2600. Since the first domains 2711 of the first polymer block domains 2710 are formed on the guide patterns 2330, the second polymer block domains 2720 may be located on the top surface of the neutral layers 2600, and adjacent to the first domains 2711 on the guide patterns 2330. The first and second polymer block domains 2710 and 2720 may be formed to have substantially the same width.

Figure 25:
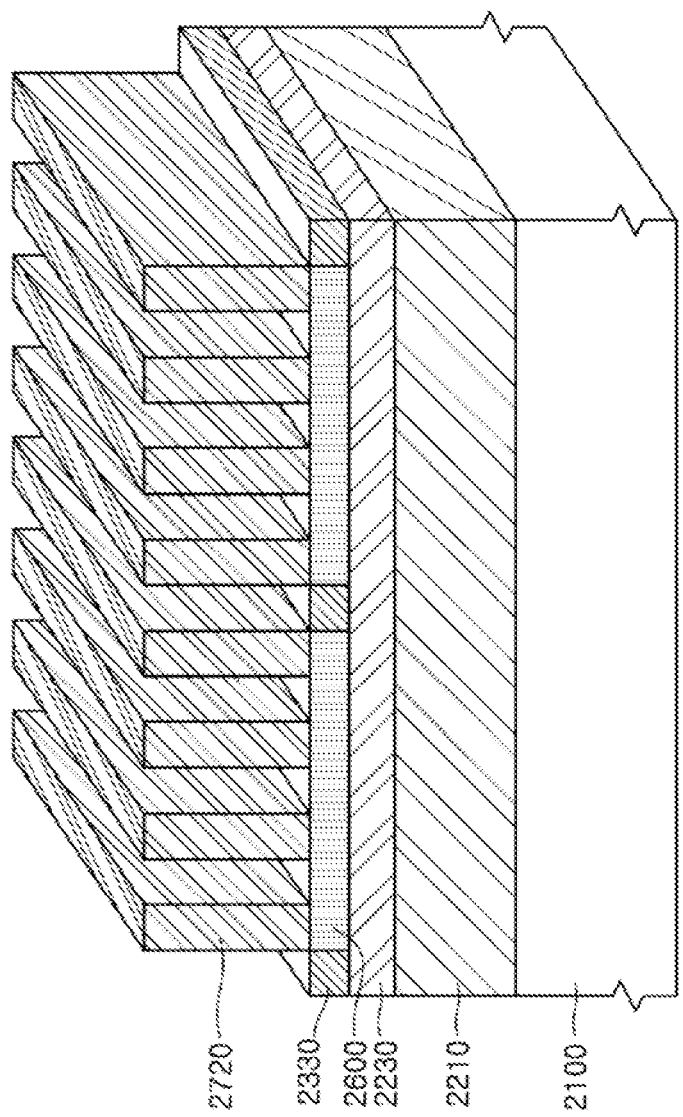

FIG. 25 illustrates a step of removing the first polymer block domains 2710.

Referring to FIG. 25, the first polymer block domains 2710 (shown in FIG. 24) may be selectively removed. Specifically, the first polymer block domains 2710 may be selectively removed using a wet etch process that employs a solvent selectively dissolving the PMMA block component in the first polymer block domains 2710. Alternatively, the first polymer block domains 2710 may be selectively removed using a dry etch process. If the first polymer block domains 2710 are selectively removed, cavities may be left between the second polymer block domains 2720.

Figure 26:
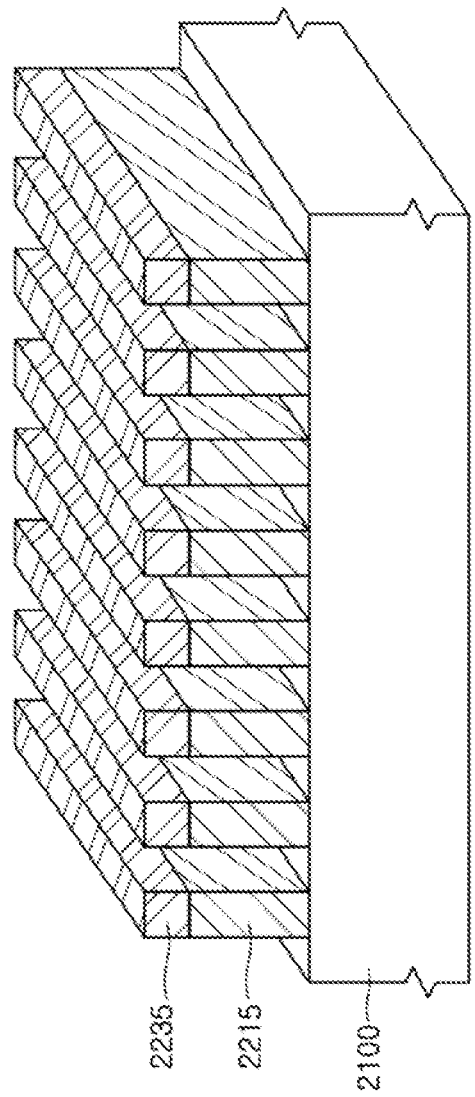

FIG. 26 illustrates a step of forming hard mask patterns 2235 and etch target patterns 2215.

Referring to FIG. 26, using the second polymer block domains 2720 as etch masks, the neutral layers 2600 and the hard mask layer 2230 may be successively etched to form neutral patterns under the second polymer block domains 2720 and the hard mask patterns 2235 under the neutral patterns. Subsequently, portions of the etch target layer 2210 exposed by the hard mask patterns 2235 may be etched to form an array of etch target patterns 2215. In some embodiments of the present disclosure, the second polymer block domains 2720 and the neutral patterns may be removed before the exposed portions of the etch target layer 2210 are etched.

FIGS. 27 to 38 are plan views and cross-sectional views illustrating a method of forming fine holes according to an embodiment of the present disclosure. This embodiment may be applied to forming fine contact holes which are repeatedly arrayed.

Figure 27:
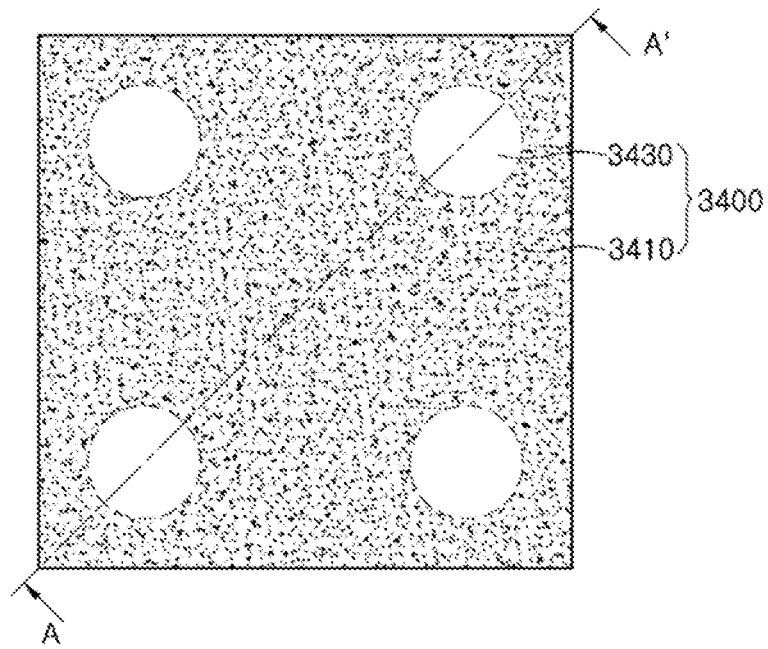
FIGS. 27 to 38 are plan views and cross-sectional views illustrating a method of forming a hole array pattern according to an embodiment of the present disclosure.
Figure 28:
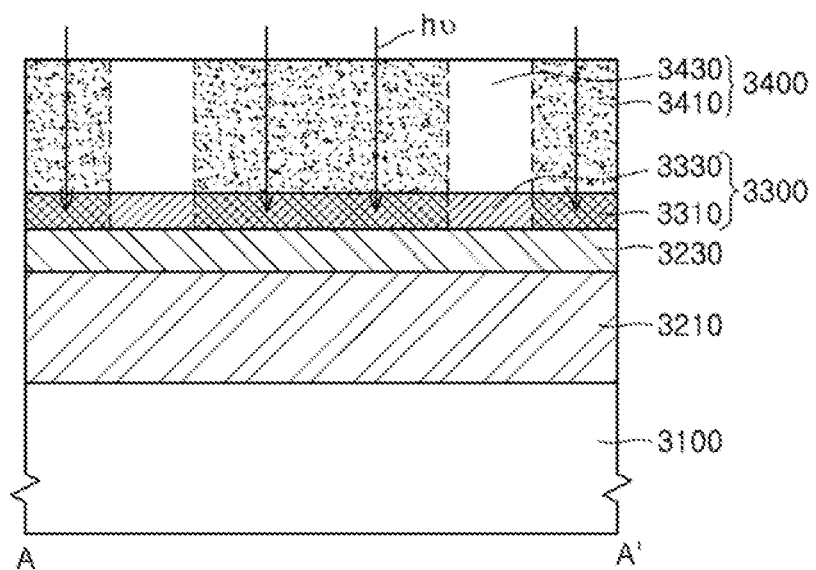

FIG. 27 is a plan view illustrating non-exposed regions 3430 of a photoresist layer 3400, and FIG. 28 is a cross-sectional view taken along a line A-A' of FIG. 27.

Referring to FIGS. 27 and 28, an etch target layer 3210 may be formed on a substrate 3100. A hard mask layer 3230 may be formed on the etch target layer 3210. A developable antireflective layer 3300 may be formed on an underlying structure including the etch target layer 3210 and the hard mask layer 3230. The developable antireflective layer 3300 may be formed of a developable bottom antireflective coating (D-BARC) material. The photoresist layer 3400 may then be formed by coating a photoresist material for negative tone development on the developable antireflective layer 3300.

The substrate including the photoresist layer 3400 may be loaded into an exposure apparatus, under a photo mask (not shown). Light having an energy of "hυ" wherein, "h" denotes Planck's constant and "υ" denotes a frequency of light, may be irradiated onto the photo mask to selectively expose portions o the photoresist layer 3400. Thus, the photoresist layer 3400 may include exposed regions 3410 and non-exposed regions 3430. The non-exposed regions 3430 may have circular shapes that are repeatedly and regularly arrayed. The non-exposed regions 3430 may be formed at vertices of tetragons. Although not shown in the drawings, in some embodiments of the present disclosure, the non-exposed regions 3430 may be formed at vertices of triangles.

During the exposure step, the light may also penetrate the photoresist layer 3400 to reach the developable antireflective layer 3300. Thus, the developable antireflective layer 3300 may also include exposed regions 3310 and non-exposed regions 3330. Accordingly, the non-exposed regions 3330 may also exist in circular shapes that are repeatedly and regularly arrayed. If the non-exposed regions 3430 of the photoresist layer 3400 are formed at vertices of tetragons, the non-exposed regions 3330 of the antireflective layer may also be formed at vertices of tetragons. Although not shown in the drawings, if the non-exposed regions 3430 are formed at vertices of triangles, the non-exposed regions 3330 may also be formed at vertices of triangles.

The exposed regions 3410 of the photoresist layer 3400 may have different solubilities than the non-exposed regions 3430 of the photoresist layer 3400. Accordingly, the non-exposed regions 3430 of the photoresist layer 3400 may be selectively removed in a subsequent development step. Before the development step is performed, the exposed photoresist layer 3400 may be subject to a post exposure bake (PEB) step.

Figure 29:
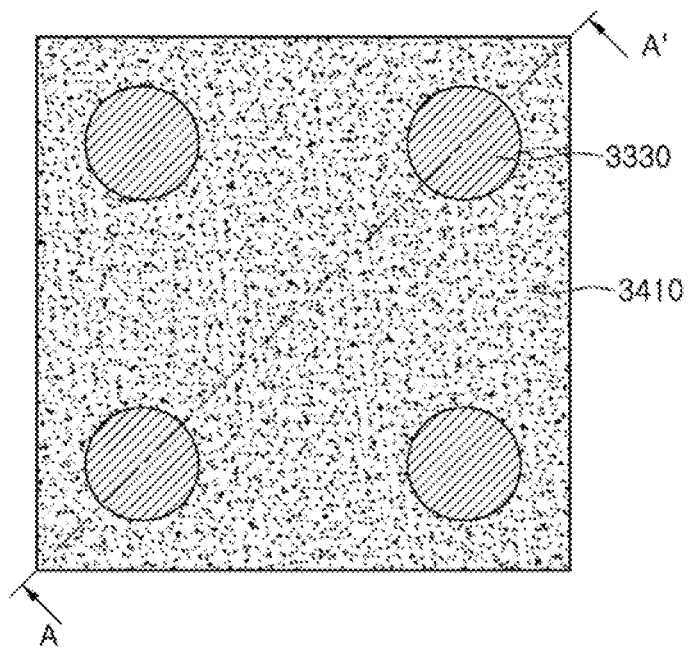
Figure 30:
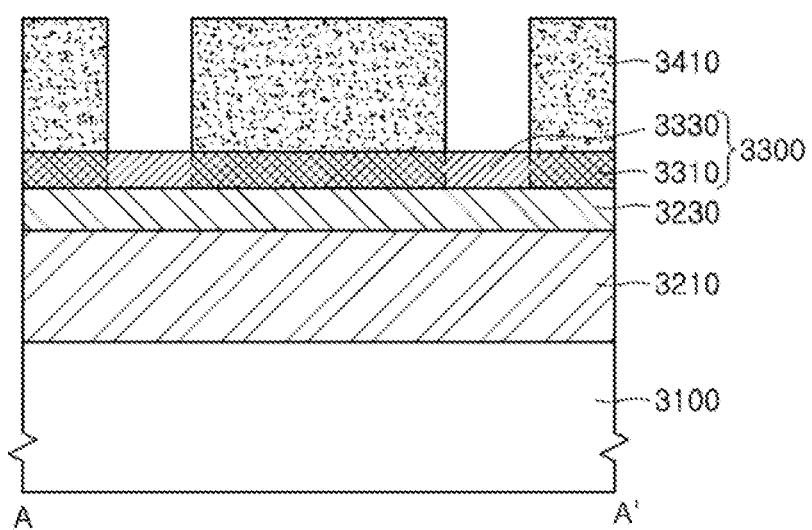

FIG. 29 is a plan view illustrating a photoresist, pattern 3410, and FIG. 30 is a cross-sectional view taken along a line A-A' of FIG. 29.

Referring to FIGS. 29 and 30, the non-exposed regions 3430 of the exposed photoresist layer 3400 may be selectively removed using a negative tone developer (NTD). The NTD may be an organic developer.

The NTD may be applied to the exposed photoresist layer 3400 using a spin coating technique or a puddle coating technique. As a result, the non-exposed regions 3430 may be selectively removed to form the photoresist pattern 3410 having circular shaped openings. During the development step, the exposed regions 3410 of the photoresist layer 3400 may remain to constitute the photoresist pattern 3410 and to expose the non-exposed regions 3330 of the developable antireflective layer 3300.

Figure 31:
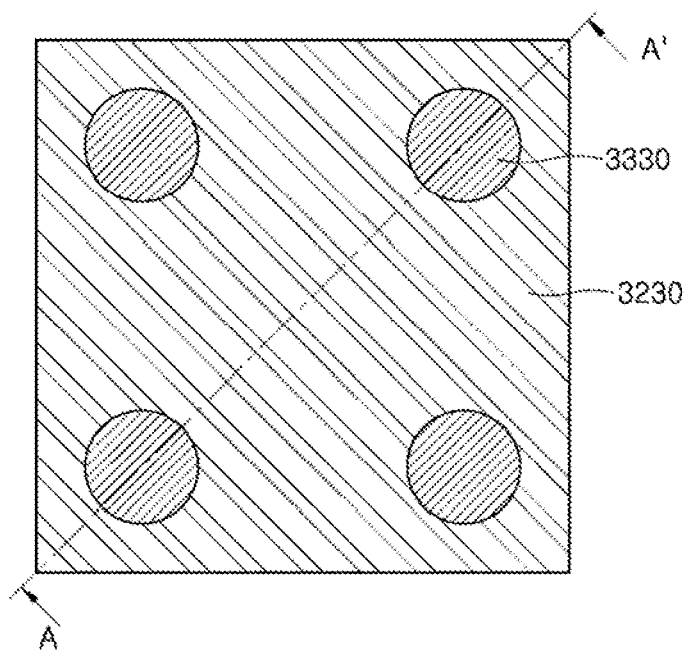
Figure 32:
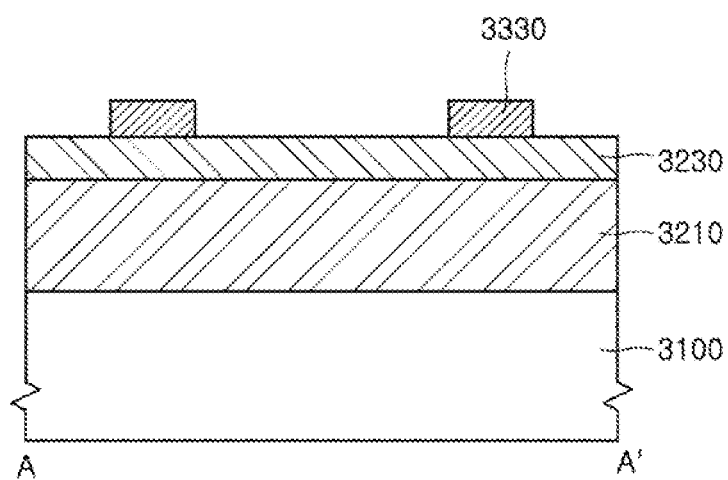

FIG. 31 is a plan view illustrating guide patterns 3410, and FIG. 32 is a cross-sectional view taken along a line A-A' of FIG. 31.

Referring to FIGS. 31 and 32, the exposed regions 3310 of FIG. 30) of the developable antireflective layer 3300 may be selectively removed. During the exposure step, light may generate acid in the exposed regions 3310 of the developable antireflective layer 3300, and the acid may break bonds between the cross-linked polymers in the exposed regions 3310 (see FIG. 15). Moreover, the acid generated in the exposed regions 3310 may be activated by heat energy provided during a PEB step to break the bonds between the cross-linked polymers in the exposed regions 3310. Accordingly, the exposed regions 3310 may be readily dissolved to a developer. In contrast, the non-exposed regions 3330 may still maintain the cross-linked state because the light is not irradiated onto the non-exposed regions 3330 during the exposure step. Thus, the solubility of the exposed regions 3310 may differ from the solubility of the non-exposed regions 3330 in a developer.

The exposed regions 3310 of the developable antireflective layer 3300 may be selectively removed using a positive tone developer (PTD). The PTD may be an alkaline developer. The alkaline developer may be a water solution containing an alkaline component. For example, the alkaline developer may be a tetra-methyl ammonium hydroxide (TMAH) solution. The TMAH solution may include a TMAH material of about 2 wt % to about 5 wt %.

The TMAH developer may be applied to the photoresist pattern 3410 and the exposed regions 3310 of the developable antireflective layer 3300 using a spin coating method. As a result, the photoresist pattern 3410 and the exposed regions 3310 may be selectively removed to leave only the non-exposed regions 3330 on the hard mask layer 3230. The non-exposed regions 3330 remaining on the hard mask layer 3230 may function as the guide patterns. Thus, the guide patterns 3330 may have circular-shaped patterns that are isolated from each other.

The development step with the NTD may be followed by the development step with a PTD. Since no processes are performed between the development step with the NTD and the development step with the PTD, the development step with the NTD and the development step with the PTD may be performed in succession using an in-situ process with a single apparatus. Thus, the number of process steps and the process time may be reduced. A rinse step may be performed after the development step with the PTD.

Figure 33:
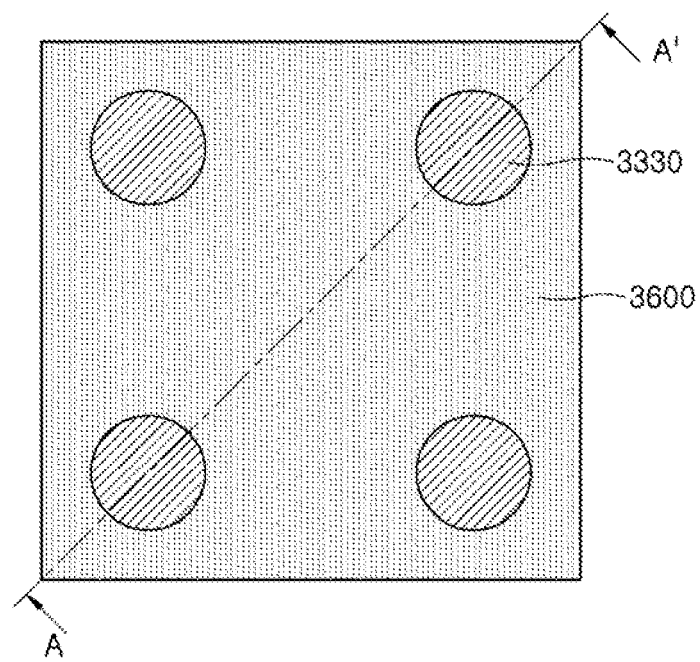
Figure 34:
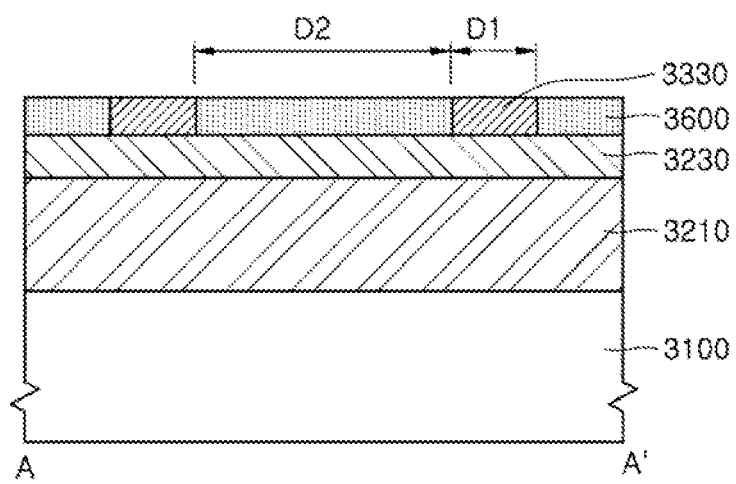

FIG. 33 is a plan view illustrating a neutral layer 3600, and FIG. 34 is a cross-sectional view taken along a line A-A' of FIG. 33.

Referring to FIGS. 33 and 34, the neutral layer 3600 may be formed in spaces between the guide patterns 3330. The guide patterns 3330 may have widths which are less than distances between the guide patterns 3330 and may expose portions of the underlying hard mask layer 3230. Thus, the neutral layer 3600 may cover the exposed portions of the hard mask layer 3230 and expose top surfaces of the guide patterns 3330. The neutral layer 3600 may induce polymer blocks constituting a BCP layer, which is formed in a subsequent process, to separate phases and form block domains that are alternately and repeatedly arranged. That is, the neutral layer 3600 may function as an orientation control layer that controls the orientation of the polymer blocks in the BCP layer, resulting in alternately and repeatedly arrayed block domains, when the BCP layer is separates into different phases.

The neutral layer 3600 may be formed of a material layer exhibiting similar affinity to all of the polymer blocks of the BCP layer. To form the neutral layer 3600, various random copolymer materials, such as a PS-r-PMMA material, may be prepared with hydroxyl groups (—OH groups) acting as terminal groups, and the random copolymer material may be dissolved in a solvent to form a neutral solution. The neutral solution may then be coated on the top surfaces of the guide patterns 3330 and the exposed portions of the hard mask layer 3230 to form a coating layer. Subsequently, a polymer brush process may be applied to the coating layer to form the neutral layer 3600, which interfaces with the exposed portions of the hard mask layer 3230. Each of the guide patterns 3330 may have a diameter D1, which is less than a distance D2 between the guide patterns 3330. The distance D2 may be set to be "D1×(2N−1)" wherein, "N" denotes a natural number which is equal to or greater than 2.

Figure 35:
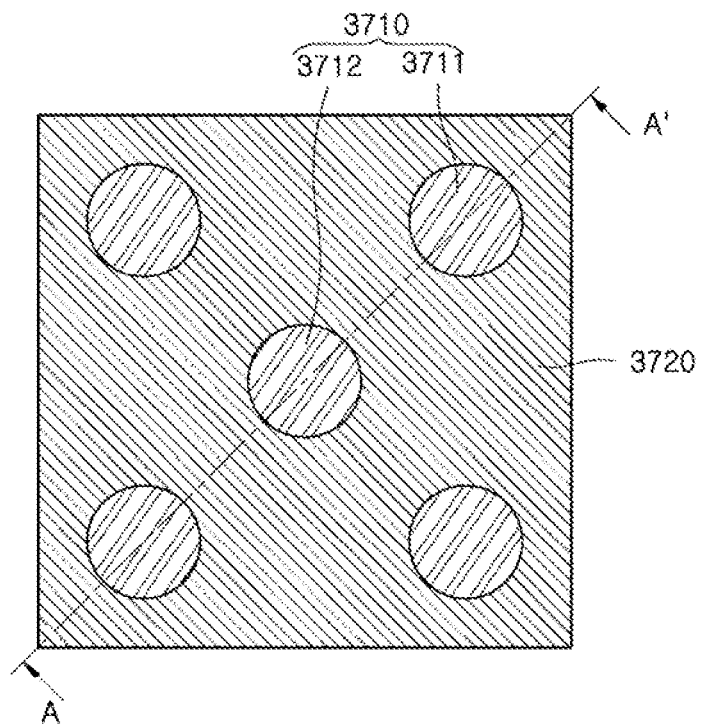
Figure 36:
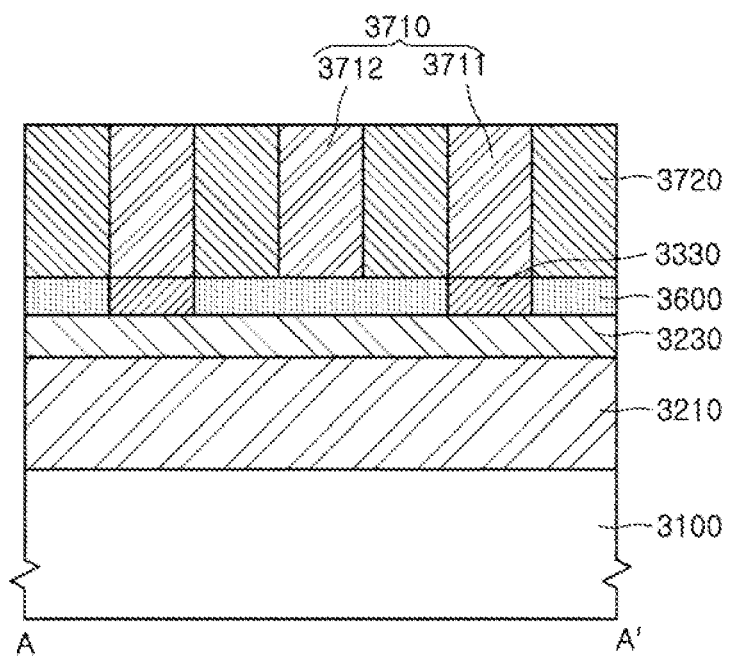

FIG. 35 is a plan view illustrating first polymer block domains 3710 and a second polymer block domain 3720, and FIG. 36 is a cross-sectional view taken along a line A-A' of FIG. 35.

Referring to FIGS. 35 and 36, a self-assembling BCP material may be coated on the guide patterns 3330 and the neutral layer 3600. The coated BCP material may be phase-separated using an annealing process to form the first polymer block domains 3710 and the second polymer block domains 3720, which are alternately and repeatedly arrayed, as shown in the cross-sectional view of FIG. 36. That is, the coated BCP material, applied in a homogeneous phase as illustrated in FIG. 17, may be phase-separated by an annealing process into the first polymer block domains 3710, corresponding to the domains "A" of FIG. 18, and the second polymer block domains 3720, corresponding to the domains "B" of FIG. 18. The first polymer block domains 3710 may have a circular pillar structure and may be repeatedly arrayed. The annealing process for phase-separation of the coated BCP material may be a thermal annealing process that is performed at a temperature of about 100° C. to about 190° C. for about one hour to about one hundred hours. As a result of the annealing process, the first polymer block domains 3710 and the second polymer block domains 3720 may be repeatedly and regularly arrayed through phase separation, as illustrated in FIG. 18.

If the BCP material is formed of a PS-b-PMMA material, the developable antireflective layer or the developable antireflective material used for forming the guide patterns 3330 may be formed of a material that has greater affinity to either the PS block component or the PMMA block component, unlike the neutral layer 3600. For example, the developable antireflective layer or the developable antireflective material used for forming the guide patterns 3330 may have greater affinity to the PMMA block component than to the PS block component. Thus, the guide patterns 3330 may align only with the first polymer block domains 3710, for example, PMMA blocks rather than the second polymer block domains 3720. That is, during the annealing process, only the PMMA blocks of the BCP material may arrange themselves on the guide patterns 3330 to form first domains 3711, constituting the first polymer block domains 3710. As described above, the neutral layer 3600 between the guide patterns 3330 may have substantially the same affinity to all of the polymer blocks of the BCP material, that is, the PS blocks and the PMMA blocks. Thus, none of the PS or PMMA block components have greater affinity to the neutral layer 3600. Therefore, the first polymer block domains 3710, that is, second domains 3712 constituting the first polymer block domains 3710, and the second polymer block domains 3720 may be alternately and repeatedly arrayed diagonally on the neutral layer 3600, as shown in FIG. 35. Since the first domains 3711 of the first polymer block domains 3710 are formed on the guide patterns 3330, the second polymer block domains 3720 may be located adjacent to the first domains 3711 formed on the guide patterns 3330. Thus if the distance D2 between the guide patterns 3330 arrayed in the diagonal direction of FIG. 35 is three times the diameter D1 of the guide patterns 3330, second domains 3712 of the first polymer block domains 3710 may be formed on central portions of spaces between the guide patterns 3330, as shown in FIG. 35. If the distance D2 increases, the number of second domains 3712 formed between the first domains 3711 may also increase.

Figure 37:
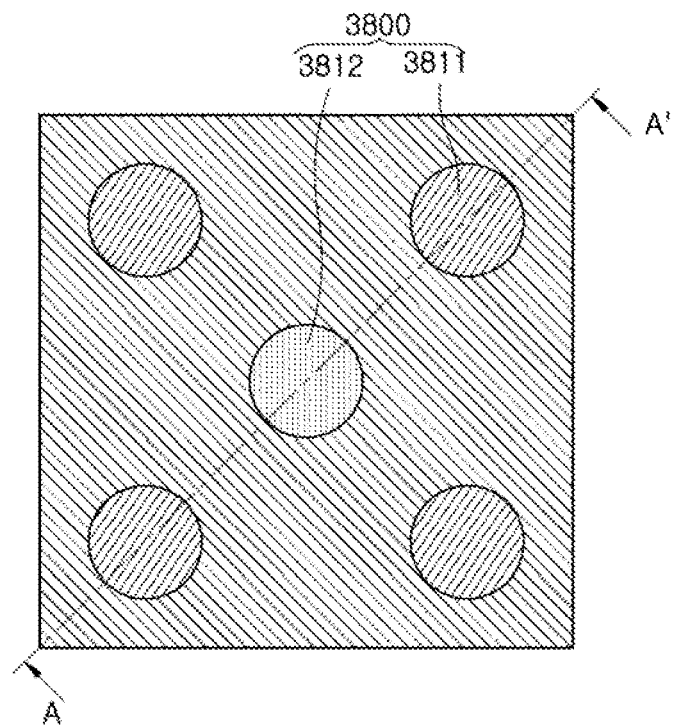
Figure 38:
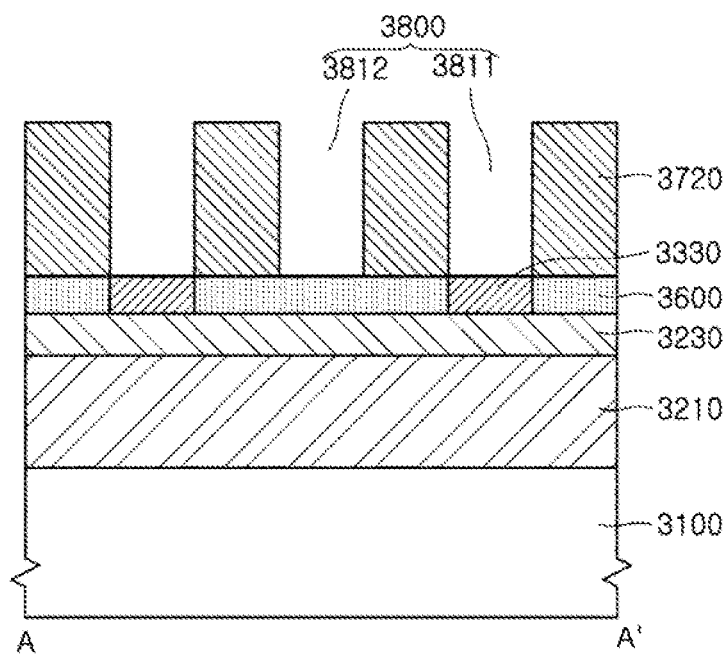

FIG. 37 is a plan view illustrating holes 3800, and FIG. 38 is a cross-sectional view taken along a line A-A' of FIG. 37.

Referring to FIGS. 37 and 38, the first polymer block domains 3710 may be selectively removed. Specifically, the first polymer block domains 3710 may be selectively removed using a wet etch process that employs a solvent selectively dissolving the PMMA block component in the first polymer block domains 3710 as an etchant. Alternatively, the first polymer block domains 3710 may be selectively removed using a dry etch process. If the first polymer block domains 3710 are selectively removed, holes 3800 surrounded by the second polymer block domain 3720 may be formed. The holes 3800 may include first holes 3811 aligned with the guide patterns 3330 and second holes 3812 arrayed between the first holes 3811.

Subsequently, although not shown in the drawings, using the second polymer block domain 3720 as an etch mask, the neutral layer 3600 and the guide patterns 3330 may be etched to expose portions of the hard mask layer 3230. The exposed portions of the hard mask layer 3230 may then be etched to form a hard mask pattern and to expose portions of the etch target layer 3210. The exposed portions of the etch target layer 3210 may be etched to form an etch target pattern with contact holes.

FIGS. 39 to 45 are cross-sectional views illustrating a method of forming fine patterns according to another embodiment of the present disclosure. This embodiment may be applied to forming guide patterns on a neutral layer.

Figure 39:
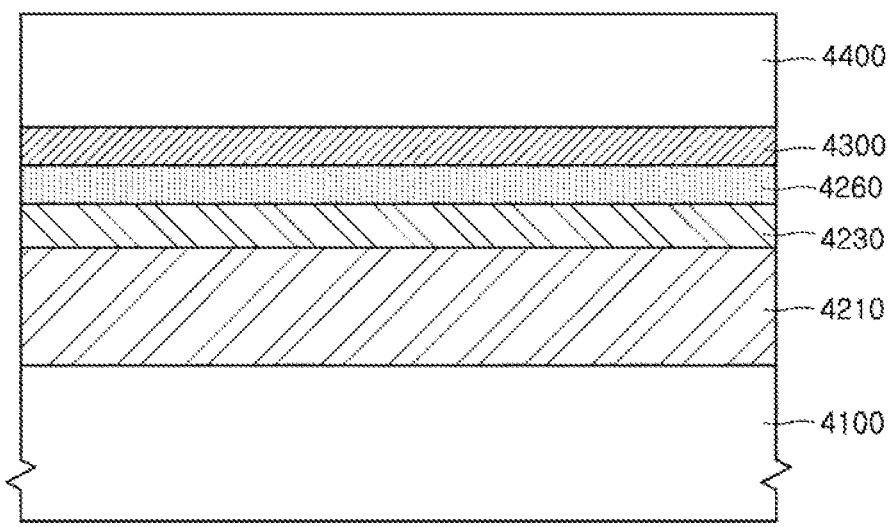
FIGS. 39 to 45 are cross-sectional views illustrating a method of forming fine patterns according to another embodiment of the present disclosure.

FIG. 39 illustrates a step of forming a stacked structure of a neutral layer 4260, a developable antireflective layer 4300 and a photoresist layer 4400.

Referring to FIG. 39, an etch target layer 4210 may be formed on a substrate 4100. The substrate 4100 may be a semiconductor substrate on which circuit elements constituting an integrated circuit are formed. The etch target layer 4210 may be patterned by an etch process. A hard mask layer 4230 may be formed on the etch target layer 4210.

The neutral layer 4260 may be formed on an underlying structure including the etch target layer 4210 and the hard mask layer 4230. The neutral layer 4260 may function as an orientation control layer that controls the orientation of polymer blocks in a BCP layer so that they are alternately and repeatedly arrayed in block domains when the BCP layer is phase-separated in a subsequent process. The neutral layer 4260 may be formed of a material that has similar affinity to all of the polymer blocks of the BCP layer. For example, the neutral layer 4260 may include a copolymer material containing polymer blocks "A" and polymer blocks "B", which are randomly copolymerized. In some embodiments of the present disclosure, if the BCP layer is formed of a polystyrene-poly(meta methyl acrylate) block copolymer (PS-b-PMMA) material, the neutral layer 4260 may include a copolymer material containing PS blocks and PMMA blocks, that is, a PS-r-PMMA material.

To form the neutral layer 4260, a polymer blushing process may be used. A random copolymer material such as a PS-r-PMMA material with hydroxyl (—OH group) terminal groups is prepared and may be dissolved in a solvent to form a neutral solution. The neutral solution may then be coated on the hard mask layer 4230 to form a coating layer. Subsequently, the coating layer may be annealed to bond the hydroxyl groups (—OH groups) of the coating layer with the surface of the hard mask layer 4230. The remaining polymer materials may be washed away.

The developable antireflective layer 4300 may be formed on the neutral layer 4260. The developable antireflective layer 4300 may be formed of a developable bottom antireflective coating (D-BARC) material. A photoresist material for negative tone development may be coated on the developable antireflective layer 4300 to form the photoresist layer 4400.

Figure 40:
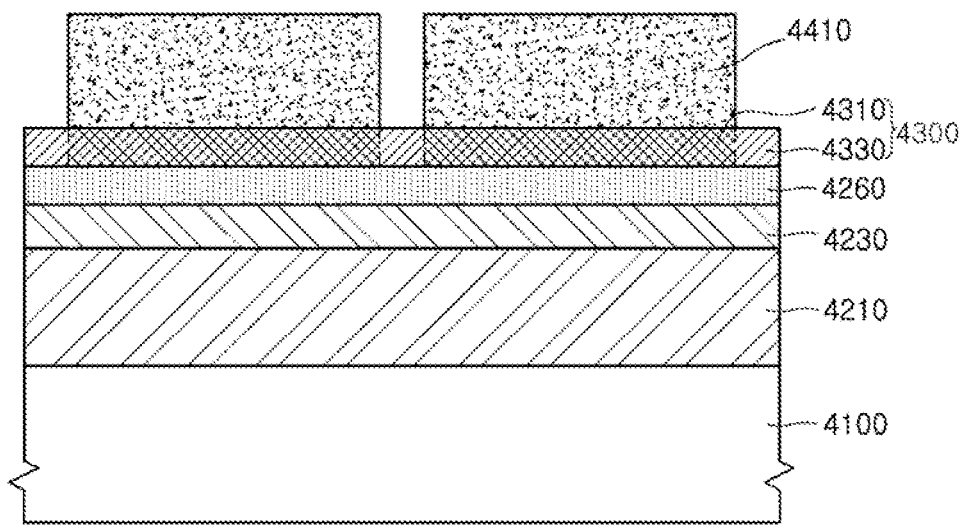

FIG. 40 illustrates a step of forming photoresist patterns 4410.

Referring to FIG. 40, the substrate including the photoresist layer 4400 may be loaded into an exposure apparatus, under a photo mask (not shown). Light having an energy of "hυ" wherein, "h" denotes Planck's constant and "υ" denotes a frequency of light, may be irradiated onto the photo mask to selectively expose portions of the photoresist layer 4400. Thus, the photoresist layer 4400 may include exposed regions and non-exposed regions. During the exposure step, the light may also penetrate the photoresist layer 4400 to reach the developable antireflective layer 4300. Thus, the developable antireflective layer 4300 may also include exposed regions 4310 and non-exposed regions 4330.

During the exposure step, an acid generator in the exposed regions 4410 of the photoresist layer 4400 may react with the light penetrated to generate acid (H+) or acidic ions. In addition, the acid generator in the exposed regions 4310 of the developable antireflective layer 4300 may also react with the light penetrated to generate acid (H+) or acidic ions. As a result, the exposed regions of the photoresist layer 4400 may have a different solubility than the non-exposed regions of the photoresist layer 4400. Accordingly, the non-exposed regions of the photoresist layer 4400 may be selectively removed to leave the exposed regions 4410, which correspond to the photoresist patterns.

The non-exposed regions of the photoresist layer 4400 may be selectively removed using a negative tone developer (NTD). The NTD may be an organic developer. The NTD may be applied to the photoresist layer 4400 using a spin coating technique or a puddle coating technique. As a result, the non-exposed regions of the photoresist layer 4400 may be selectively removed to expose the non-exposed regions 4330 of the developable antireflective layer 4300.

Figure 41:
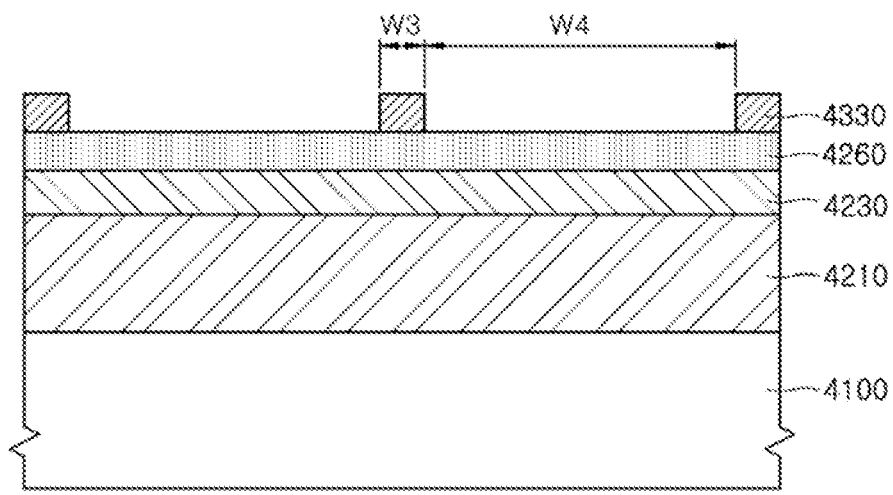

FIG. 41 illustrates a step of forming guide patterns 4330.

Referring to FIG. 41, the exposed regions (4310 of FIG. 40) of the developable antireflective layer 4300 may be selectively removed. During the exposure step, the light may generate acid in the exposed regions 4310 of the developable antireflective layer 4300, and the acid may break bonds between the cross-linked polymers in the exposed regions 4310 (see FIG. 15). Moreover, the acid generated in the exposed regions 4310 may be activated by heat energy provided during a PEB step to break the bonds between the cross-linked polymers in the exposed regions 4310. Accordingly, the exposed regions 4310 may be readily dissolved in a solvent. In contrast, the non-exposed regions 4330 may still maintain the cross-linked state since light was not irradiated on the non-exposed regions 4330 during the exposure step. Thus, the solubility of the exposed regions 4310 may be different than the solubility of the non-exposed regions 4330 in a developer.

The exposed regions 4310 of the developable antireflective layer 4300 may be selectively removed using a positive tone developer (PTD). The PTD may be an alkaline developer. The alkaline developer may be a water solution containing an alkaline component. For example, the alkaline developer may be a tetra-methyl ammonium hydroxide (TMAH) solution. The TMAH developer may be applied to the photoresist pattern 4410 and the exposed regions 4310 of the developable antireflective layer 4300 using a spin coating method. As a result, the photoresist pattern 4410 and the exposed regions 4310 may be selectively removed to leave only the non-exposed regions 4330 on the neutral layer 4260. The non-exposed regions 4330 remaining on the neutral layer 4260 may function as the guide patterns. Thus, the photoresist pattern 4410 and the exposed regions 4310 may be simultaneously removed using the PTD, or the photoresist pattern 4410 may be lifted off after the exposed regions 4310 are removed by the PTD.

The development step with the NTD may be followed by the development step with the PTD. Since no processes are performed between the development step with the NTD and the development step with the PTD, the development step with the NTD and the development step with the PTD may be performed in succession using an in-situ process with a single piece of equipment. Thus, the number of process steps and/or the process time may be reduced. A rinse step may be performed after the development step with the PTD.

The guide patterns 4330 may be spaced apart from each other, and portions of the neutral layer 4260 may be exposed by spaces between the guide patterns 4330. Each of the guide patterns 4330 may have a width that is less than the distance between the guide patterns 4330. That is, the width W3 of each of the guide patterns 4330 may be less than the width W4 of each of the exposed portions of the neutral layer 4260. For example, the width W4 of each of the exposed portions of the neutral layer 4260 may be set to be "W3×(2N−1)" wherein, "N" denotes a natural number which is equal to or greater than 2.

Figure 42:
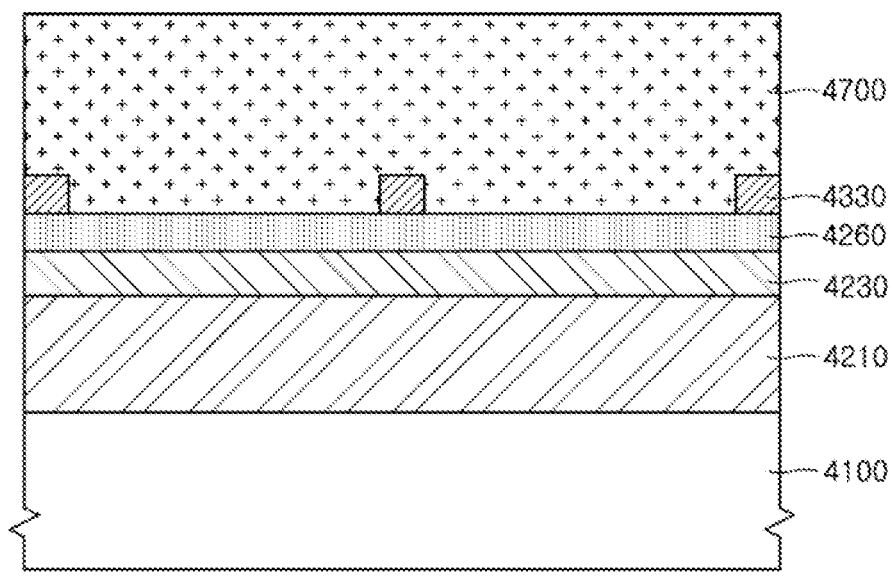

FIG. 42 illustrates a step of forming a BCP layer 4700.

Referring to FIG. 42, a self-assembling BCP material may be coated on the guide patterns 4330 and the neutral layer 4260 to form the BCP layer 4700. The BCP layer may be formed of a PS-b-PMMA material or a PS-PDMS block copolymer material.

Figure 43:
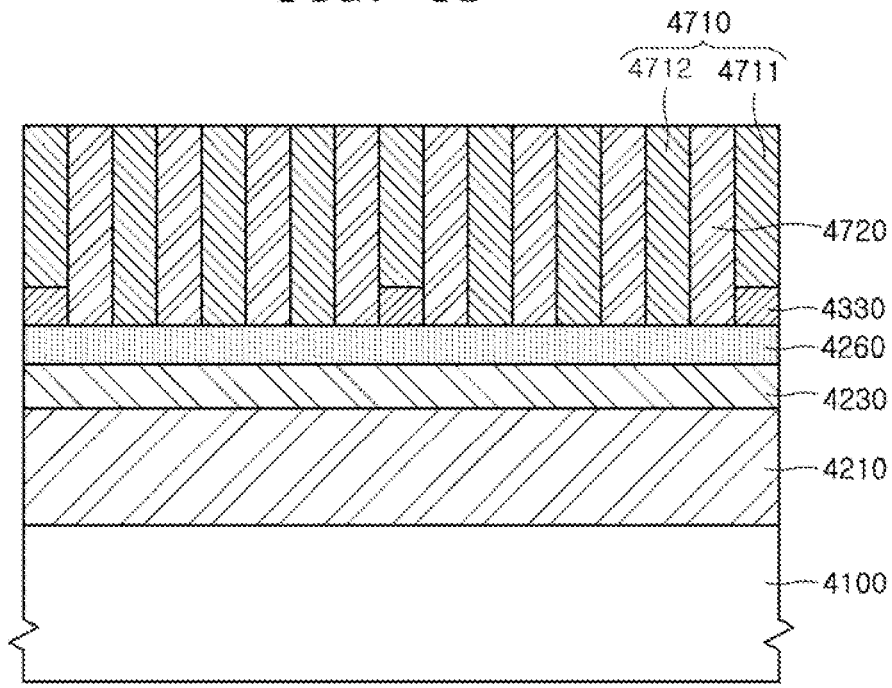

FIG. 43 illustrates a step of forming first polymer block domains 4710 and second polymer block domains 4720.

Referring to FIG. 43, the BCP layer 4700 (shown in FIG. 42) may be phase-separated using an annealing process to form the first polymer block domains 4710 and the second polymer block domains 4720, which are alternately and repeatedly arrayed. That is, the BCP layer 4700 may be applied having a homogeneous phase, as illustrated in FIG. 17, and may separate phases, to form the first polymer block domains 4710, for example, PMMA polymer blocks, and the second polymer block domains 4720, for example, PS polymer blocks, using an annealing process. The first polymer block domains 4710 and the second polymer block domains 4720 may be alternately and repeatedly arrayed in a linear fashion. Alternatively, the first polymer block domains 4710 may have circular pillar shapes that are isolated from each other and surrounded by the second polymer block domains 4720.

If the BCP layer 4700 is formed of a PS-b-PMMA material, the developable antireflective layer or the developable antireflective material used for forming the guide patterns 4330 may be formed of a material that has greater affinity to either the PS block component or the PMMA block component, unlike the neutral layers 4260. For example, the developable antireflective layer or the developable antireflective material used for forming the guide patterns 4330 may have greater affinity to the PMMA block component than to the PS block component. Thus, the guide patterns 4330 may align with the first polymer block domains 4710, for example, PMMA blocks, rather than the second polymer block domains 2720. That is, during the annealing process, only the PMMA blocks of the BCP material may be aligned with the guide patterns 4330 to form first domains 4711 constituting the first polymer block domains 4710. As described above, the neutral layer 4260 may have substantially the same affinity to all of the polymer blocks of the BCP material, that is, the PS blocks and the PMMA blocks. Thus, neither the PS block components nor the PMMA block components have superior affinity to the neutral layer 4260. Therefore, the first polymer block domains 4710, that is, second domains 4712 constituting the first polymer block domains 4710, and the second polymer block domains 4720 may be alternately and repeatedly arrayed on the neutral layer 4260. Since the first domains 4711 of the first polymer block domains 4710 are formed on the guide patterns 4330, the second polymer block domains 2720 may be located adjacent to the first domains 4711.

Figure 44:
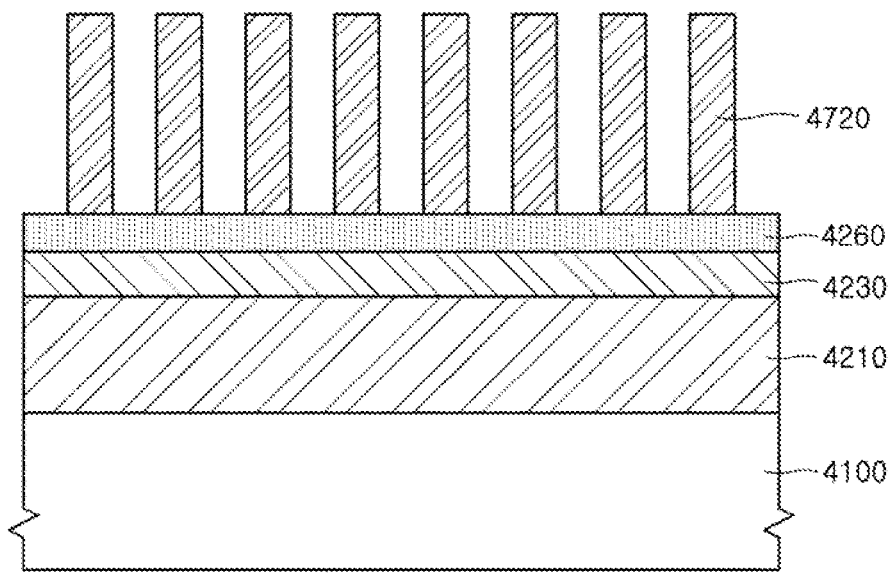

FIG. 44 illustrates a step of removing the first polymer block domains 4710 and the guide patterns 4330.

Referring to FIG. 44, the first polymer block domains 4710 may be selectively removed. Specifically, the first polymer block domains 4710 may be selectively removed using a wet etch process that employs a solvent selectively dissolving the PMMA block components in the first polymer block domains 4710. Alternatively, the first polymer block domains 4710 may be selectively removed using a dry etch process. If the first polymer block domains 4710 are selectively removed, cavities or holess may be left between the second polymer block domains 4720. Subsequently, the guide patterns 4330 may be removed.

Figure 45:
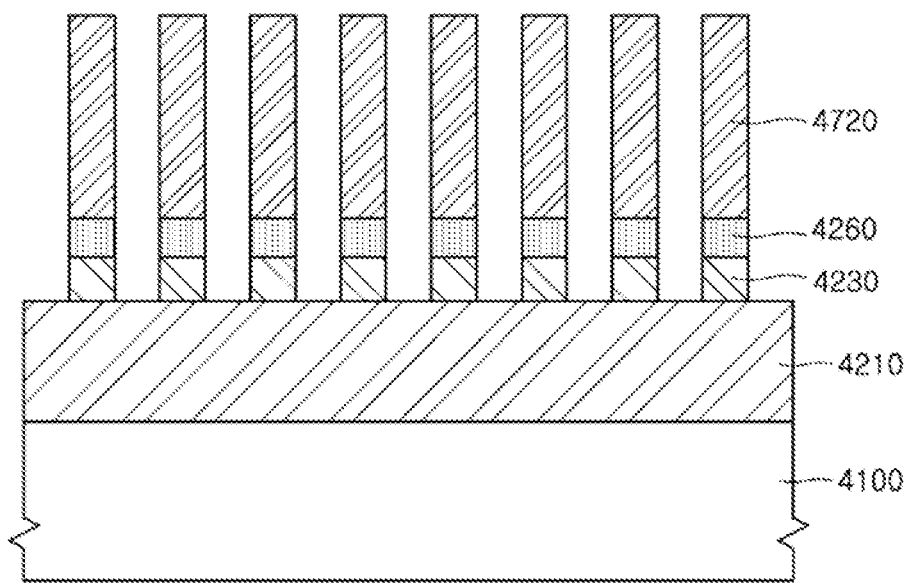

FIG. 45 illustrates a step of patterning the neutral layer 4260 and the hard mask layer 4230.

Referring to FIG. 45, using the second polymer block domains 4720 as etch masks, the neutral layer 4260 and the hard mask layer 4230 may be successively etched to form neutral patterns under the second polymer block domains 4720 and the hard mask patterns under the neutral patterns. Subsequently, although not shown in the drawings, portions of the etch target layer 4210, exposed by the hard mask patterns, may be etched to form etch target patterns.

According to the embodiments described above, nano-scale structures or nano structures can be fabricated on large substrates using phase separation techniques of a BCP layer. The nano-scale structures may be used in fabrication of polarizing plates or in formation of reflective lenses in reflective liquid crystal display (LCD) units. The nano structures may also be used in fabrication of separate polarizing plates as well as in formation of polarizing parts, including display panels. For example, the nano structures may be used in the fabrication array substrates, including thin film transistors, or in processes for directly forming polarizing parts on color filter substrates. Further, the nano structures may be used in molding processes for fabricating nanowire transistors or memories, molding processes for fabricating electronic/electric components such as nano-scaled interconnections, molding process for fabricating catalysts of solar cells and fuel cells, molding process for fabricating etch masks and organic light emitting diodes (OLEDs), and molding processes for fabricating gas sensors.

The methods according to the aforementioned embodiments of the present disclosure and structures formed thereby may be used in fabrication of integrated circuit (IC) chips. The IC chips may be supplied to users in a raw wafer form, in a bare die form or in a package form. The IC chips may also be supplied in a single package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims

What is claimed is:
1. A method of forming patterns, the method comprising:
forming a developable antireflective layer on an underlying layer disposed on a semiconductor substrate;
forming a photoresist layer on the developable antireflective layer;
selectively exposing portions of the photoresist layer and portions of the developable antireflective layer to light;
selectively removing non-exposed portions of the photoresist layer to form a photoresist pattern exposing non-exposed portions of the developable antireflective layer;
selectively removing the exposed portions of the developable antireflective layer to form guide patterns;
forming a neutral layer that fills a space between the guide patterns;
forming a self-assembling block copolymer (BCP) layer on the guide patterns and the neutral layer;
annealing the self-assembling BCP layer to form first polymer block domains and second polymer block domains, which are alternately and repeatedly arrayed; and
selectively removing the first polymer block domains.

2. The method of claim 1, wherein the selectively removing non-exposed portions of the photoresist layer is performed using a negative tone developer.

3. The method of claim 1, wherein the selectively removing the exposed portions of the developable antireflective layer is performed using a positive tone developer.

4. The method of claim 3, wherein the positive tone developer is an alkaline developer including a tetra-methyl ammonium hydroxide (TMAH) material.

5. The method of claim
wherein add is generated in the exposed portions of the photoresist layer when the portions of the photoresist layer and the portions of the developable antireflective layer are exposed to the light; and
wherein the acid generated in the exposed portions of the photoresist layer is diffused into the exposed portions of the developable antireflective layer so that the exposed portions of the developable antireflective layer are dissolved by the positive tone developer.

6. The method of claim 5, further comprising applying a post exposure bake (PEB) step to the exposed photoresist layer to accelerate the generation of acid in the exposed portions of the photoresist layer and accelerate diffusion of the acid into the exposed portions of the developable antireflective layer.

7. The method of claim 3, wherein the photoresist pattern is removed while the exposed portions of the developable antireflective layer are selectively removed using the positive tone developer.

8. The method of claim 3, further comprising removing a side surface portion of the photoresist pattern with an organic solvent to expose edge portions of the exposed portions of the developable antireflective layer.

9. The method of claim 1, wherein the self-assembling BCP layer includes a first polymer block component and a second polymer block component, which are suitable for phase separation during the annealing of the self-assembling BCP layer; and
wherein the first polymer block domains are formed of the first polymer block component and the second polymer block domains are formed of the second polymer block component.

10. The method of claim 9,
wherein the developable antireflective layer is formed material that has greater affinity to the first polymer block component than to the second polymer block component; and
wherein the first polymer block domains are formed on the guide patterns when the self-assembling BCP layer is annealed.

11. The method of claim 9,
wherein the self-assembling BCP layer includes a polystyrene-poly(meta methyl acrylate) block copolymer (PS-b-PMMA) material; and
wherein the developable antireflective layer includes an organic material having a greater affinity to the PMMA polymer block component than to the PS polymer block component.

12. The method of claim 9, wherein the neutral layer has substantially the same affinity to both the first and second polymer block components, so that the first polymer block domains and the second polymer block domains are alternately and repeatedly arrayed on the neutral layer.

13. The method of claim 9, wherein forming the neutral layer includes:
preparing a polymer material having hydroxyl groups (—OH groups) that act as terminal groups to bond with the underlying layer, which is exposed by the guide patterns;
coating the polymer material having the hydroxyl groups on the guide patterns and the underlying layer;
annealing the polymer material to bond the hydroxyl groups of the polymer material with the underlying layer; and
selectively removing the polymer material on the guide patterns using a polymer brush process,
wherein the polymer brush process is performed using a solvent.

14. The method of claim 1, wherein the neutral layer is formed to have a top surface that is substantially coplanar with top surfaces of the guide patterns.

15. The method of claim 1, wherein the guide patterns are spaced apart from each other such that a distance between the guide patterns is "W×(2N−1)"; and
wherein, "N" denotes a natural number which is equal to or greater than 2 and "W" denotes a width of each of the guide patterns.

16. A method of forming patterns, the method comprising forming a developable antireflective layer on an underlying layer disposed on a semiconductor substrate;
forming a photoresist layer on the developable antireflective layer;
selectively exposing portions of the photoresist layer and portions of the developable antireflective layer to light to define line-shaped non-exposed portions of the photoresist layer and the developable antireflective layer;
selectively removing the non-exposed portions of the photoresist layer to form a photoresist pattern that provides trenches exposing the non-exposed portions of the developable antireflective layer;
selectively removing the exposed portions of the developable antireflective layer to form line-shaped guide patterns having a width which is less than a distance between the line-shaped guide patterns;
forming a neutral layer that fills a space between the guide patterns;
forming a self-assembling block copolymer (BCP) layer on the guide patterns and the neutral layer;
annealing the self-assembling BCP layer to form line-shaped first polymer block domains and line-shaped second polymer block domains, which are alternately and repeatedly arrayed; and
selectively removing the first polymer block domains.

17. A method of forming patterns, the method comprising:
forming a developable antireflective layer on an underlying layer disposed on a semiconductor substrate;
forming a photoresist layer on the developable antireflective layer;
selectively exposing portions of the photoresist layer and portions of the developable antireflective layer to light to define circular-shaped non-exposed portions of the photoresist layer and the developable antireflective layer;
selectively removing the non-exposed portions of the photoresist layer to form a photoresist pattern exposing the non-exposed portions of the developable antireflective layer;
selectively removing the exposed portions of the developable antireflective layer to form circular-shaped guide patterns having a width that is less than a distance between the circular-shaped guide patterns;
forming a neutral aye that fills a space between the guide patterns;
forming a self-assembling block copolymer (BCP) layer on the guide patterns and the neutral layer;
annealing the self-assembling BCP layer to form first polymer block domains and second polymer block domains surrounding sidewalls of the first polymer block domains; and
selectively removing the first polymer block domains to form holes.

18. The method of claim 17, wherein the selectively removing the non-exposed portions of the photoresist layer is performed using a negative tone developer.

19. The method of claim 18, wherein the selectively removing the exposed portions of the developable antireflective layer is performed using a positive tone developer.

20. The method of claim 19,
wherein acid is generated in the exposed portions of the photoresist layer while the portions of the photoresist layer and the portions of the developable antireflective layer are exposed to the light; and
wherein the acid generated in the exposed portions of the photoresist layer diffuses into the exposed portions of the developable antireflective layer such that the exposed portions of the developable antireflective layer are suitable for being dissolved by the positive tone developer.

* * * * *